United States Patent
Kang et al.

(10) Patent No.: US 11,462,260 B2
(45) Date of Patent: *Oct. 4, 2022

(54) NONVOLATILE MEMORY DEVICES

(71) Applicant: Samsung Electronics Co., Ltd., Suwon-si (KR)

(72) Inventors: Hee-Woong Kang, Suwon-si (KR); Dong-Hun Kwak, Hwaseong-si (KR); Jun-Ho Seo, Hwaseong-si (KR); Hee-Won Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/321,393

(22) Filed: May 14, 2021

(65) Prior Publication Data

US 2021/0272617 A1 Sep. 2, 2021

Related U.S. Application Data

(60) Continuation of application No. 16/991,693, filed on Aug. 12, 2020, now Pat. No. 11,017,838, which is a
(Continued)

(30) Foreign Application Priority Data

Aug. 4, 2016 (KR) .................. 10-2016-0099219

(51) Int. Cl.
*G11C 7/10* (2006.01)
*G11C 11/4074* (2006.01)
(Continued)

(52) U.S. Cl.
CPC .......... *G11C 11/4074* (2013.01); *G11C 7/109* (2013.01); *G11C 7/12* (2013.01);
(Continued)

(58) Field of Classification Search
CPC ....... G11C 11/4074; G11C 7/109; G11C 7/12; G11C 8/12; G11C 11/4082;
(Continued)

(56) References Cited

U.S. PATENT DOCUMENTS 5,737,258 A 4/1998 Choi et al.
6,175,522 B1 1/2001 Fang
(Continued)

FOREIGN PATENT DOCUMENTS

CN 001841553 A 10/2006
CN 101369464 A 2/2009
(Continued)

*Primary Examiner* — Michael T Tran
(74) *Attorney, Agent, or Firm* — Muir Patent Law, PLLC

(57) ABSTRACT

A nonvolatile memory device includes a memory cell array and a row decoder. The memory cell array includes a plurality of mats. A first cell string of first mat is connected to a plurality of first word-lines, a first bit-line and a first string selection line. A second cell string of second mat is connected to a plurality of second word-lines, a second bit-line and a second string selection line. Each of the first and second cell strings includes a ground selection transistor, memory cells, and a string selection transistor coupled in series. The row decoder applies a first voltage to a third word-line among the plurality of first and second word-lines for a first period of time in a single mat mode and to apply a second voltage to the third word-line for a second period of time longer than the first period of time in a multi-mat mode.

15 Claims, 27 Drawing Sheets

Related U.S. Application Data continuation-in-part of application No. 16/817,951, filed on Mar. 13, 2020, now Pat. No. 10,777,254, which is a continuation of application No. 16/675,331, filed on Nov. 6, 2019, now Pat. No. 10,672,454, which is a continuation of application No. 16/183,315, filed on Nov. 7, 2018, now Pat. No. 10,629,254, which is a division of application No. 15/604,406, filed on May 24, 2017, now Pat. No. 10,153,029.

(51) Int. Cl.

| | | |
|---|---|---|
| *G11C 8/12* | (2006.01) | |
| *G11C 16/08* | (2006.01) | |
| *G11C 11/408* | (2006.01) | |
| *G11C 11/4097* | (2006.01) | |
| *G11C 11/56* | (2006.01) | |
| *G11C 16/04* | (2006.01) | |
| *G11C 16/06* | (2006.01) | |
| *G11C 16/10* | (2006.01) | |
| *G11C 16/30* | (2006.01) | |
| *G11C 16/34* | (2006.01) | |
| *G11C 7/12* | (2006.01) | |

(52) U.S. Cl.
CPC ............ *G11C 8/12* (2013.01); *G11C 11/4082* (2013.01); *G11C 11/4085* (2013.01); *G11C 11/4097* (2013.01); *G11C 11/5628* (2013.01); *G11C 16/0483* (2013.01); *G11C 16/06* (2013.01); *G11C 16/08* (2013.01); *G11C 16/10* (2013.01); *G11C 16/30* (2013.01); *G11C 16/3436* (2013.01); *G11C 2207/2209* (2013.01)

(58) Field of Classification Search
CPC ............ G11C 11/4085; G11C 11/4097; G11C 11/5628; G11C 16/0483; G11C 16/06; G11C 16/08; G11C 16/10; G11C 16/30; G11C 16/3436; G11C 2207/2209; G11C 8/08; G11C 16/16; G11C 16/24; G11C 16/26; G11C 16/32; G11C 16/3459
USPC .............................................. 365/189.05, 226
See application file for complete search history.

(56) References Cited

U.S. PATENT DOCUMENTS

| | | | |
|---|---|---|---|
| 6,282,121 B1 | 8/2001 | Cho et al. | |
| 6,535,412 B1* | 3/2003 | Maruyama | G11C 11/4087 365/230.01 |
| 7,310,258 B2 | 12/2007 | Lee et al. | |
| 7,570,523 B2 | 8/2009 | Scheuerlein et al. | |
| 7,675,783 B2 | 3/2010 | Park et al. | |
| 7,813,212 B2 | 10/2010 | Kim | |
| 7,916,540 B2 | 3/2011 | Byeon | |
| 7,978,499 B2 | 7/2011 | Hosono et al. | |
| 8,068,365 B2 | 11/2011 | Kim | |
| 8,335,117 B2 | 12/2012 | Kitagawa et al. | |
| 8,456,914 B2 | 6/2013 | Missiroli et al. | |
| 8,724,390 B2 | 5/2014 | Hung et al. | |
| 8,824,207 B2 | 9/2014 | Kim et al. | |
| 8,873,294 B2 | 10/2014 | Shim et al. | |
| 8,908,410 B2 | 12/2014 | Ichige | |
| 8,953,395 B2 | 2/2015 | Seningen et al. | |
| 8,976,595 B2 | 3/2015 | Jeong et al. | |
| 9,093,132 B2 | 7/2015 | Kim et al. | |
| 9,117,503 B2 | 8/2015 | Lee et al. | |
| 9,236,128 B1 | 1/2016 | Louie et al. | |
| 9,236,139 B1 | 1/2016 | Lai et al. | |
| 9,245,639 B1 | 1/2016 | Lee et al. | |
| 9,281,067 B1 | 3/2016 | Lee et al. | |
| 9,324,427 B2 | 4/2016 | Nagashima et al. | |
| 9,390,808 B1 | 7/2016 | Kato | |
| 9,396,776 B2 | 7/2016 | Yang | |
| 9,406,359 B2 | 8/2016 | Park et al. | |
| 9,514,827 B1* | 12/2016 | Nam | G11C 16/0483 |
| 9,721,653 B2 | 8/2017 | Yan et al. | |
| 9,799,406 B2 | 10/2017 | Sato et al. | |
| 10,157,653 B1 | 12/2018 | Li | |
| 11,309,016 B1* | 4/2022 | Lin | G11C 11/4097 |
| 2003/0035322 A1 | 2/2003 | Wong | |
| 2003/0128581 A1* | 7/2003 | Scheuerlein | H01L 27/1021 257/E27.073 |
| 2004/0264262 A1 | 12/2004 | Ishimoto et al. | |
| 2005/0144361 A1 | 6/2005 | Gonzalez et al. | |
| 2005/0285862 A1 | 12/2005 | Noda et al. | |
| 2007/0086243 A1 | 4/2007 | Jo | |
| 2007/0245098 A1 | 10/2007 | Takada | |
| 2007/0252201 A1* | 11/2007 | Kito | H01L 27/105 257/E21.679 |
| 2008/0089129 A1 | 4/2008 | Lee | |
| 2008/0094904 A1* | 4/2008 | Byeon | G11C 16/30 365/185.33 |
| 2008/0205163 A1 | 8/2008 | Park et al. | |
| 2008/0248622 A1* | 10/2008 | Matamis | H01L 27/11543 257/E21.409 |
| 2009/0141545 A1 | 6/2009 | Norman | |
| 2009/0168534 A1 | 7/2009 | Park et al. | |
| 2009/0213648 A1 | 8/2009 | Slesazeck | |
| 2010/0002514 A1 | 1/2010 | Lutze et al. | |
| 2010/0002515 A1 | 1/2010 | Lutze et al. | |
| 2010/0002516 A1* | 1/2010 | Sim | H01L 27/11551 257/E21.409 |
| 2010/0042774 A1 | 2/2010 | Yang et al. | |
| 2010/0193861 A1* | 8/2010 | Shim | H01L 27/11556 257/329 |
| 2011/0026348 A1 | 2/2011 | Narui | |
| 2011/0141802 A1 | 6/2011 | Ong | |
| 2011/0209031 A1 | 8/2011 | Kim et al. | |
| 2011/0287597 A1* | 11/2011 | Kito | H01L 27/11578 438/261 |
| 2012/0033498 A1 | 2/2012 | Kim | |
| 2012/0044771 A1 | 2/2012 | Joo | |
| 2012/0127802 A1 | 5/2012 | Choi | |
| 2012/0155168 A1 | 6/2012 | Kim et al. | |
| 2012/0170365 A1 | 7/2012 | Kang et al. | |
| 2012/0230116 A1 | 9/2012 | Goda et al. | |
| 2012/0250437 A1 | 10/2012 | Nagata | |
| 2012/0254680 A1 | 10/2012 | Oh et al. | |
| 2012/0281479 A1 | 11/2012 | Kochar et al. | |
| 2012/0300561 A1* | 11/2012 | Yun | G11C 5/025 365/189.011 |
| 2013/0127011 A1* | 5/2013 | Higashitani | H01L 28/87 257/532 |
| 2013/0128668 A1 | 5/2013 | Kim | |
| 2013/0163361 A1 | 6/2013 | Nomoto et al. | |
| 2013/0170280 A1 | 7/2013 | Toda | |
| 2013/0176790 A1 | 7/2013 | Nguyen et al. | |
| 2013/0223158 A1 | 8/2013 | Seningen et al. | |
| 2013/0223170 A1 | 8/2013 | Kajigaya | |
| 2013/0229868 A1 | 9/2013 | Koh et al. | |
| 2013/0238843 A1 | 9/2013 | Kim et al. | |
| 2013/0250654 A1 | 9/2013 | Sugimae et al. | |
| 2013/0308403 A1 | 11/2013 | Nakai et al. | |
| 2013/0329489 A1 | 12/2013 | Kim et al. | |
| 2014/0025866 A1 | 1/2014 | Kim et al. | |
| 2014/0050010 A1 | 2/2014 | Toda | |
| 2014/0056055 A1 | 2/2014 | Ikeda et al. | |
| 2014/0063952 A1 | 3/2014 | Hara et al. | |
| 2014/0068161 A1 | 3/2014 | Yi et al. | |
| 2014/0078814 A1 | 3/2014 | Shimakawa et al. | |
| 2014/0092680 A1 | 4/2014 | Lee et al. | |
| 2014/0160847 A1 | 6/2014 | Kwak | |
| 2014/0192594 A1 | 7/2014 | Lue | |
| 2014/0198576 A1 | 7/2014 | Hung et al. | |
| 2014/0198581 A1 | 7/2014 | Kim et al. | |
| 2014/0211582 A1 | 7/2014 | Riho et al. | |
| 2014/0306279 A1* | 10/2014 | Park | H01L 27/11556 257/314 |
| 2015/0037931 A1 | 2/2015 | Kuniya | |
| 2015/0063013 A1 | 3/2015 | Iizuka | |

(56) References Cited

U.S. PATENT DOCUMENTS

| | | | |
|---|---|---|---|
| 2015/0131387 A1 | 5/2015 | Jeon et al. | |
| 2015/0146494 A1 | 5/2015 | Rhio | |
| 2015/0153955 A1* | 6/2015 | Kwak | G11C 16/26 711/103 |
| 2015/0162093 A1 | 6/2015 | Oh et al. | |
| 2015/0162341 A1* | 6/2015 | Aritome | H01L 27/11573 257/314 |
| 2015/0213886 A1 | 7/2015 | Toda | |
| 2015/0243355 A1 | 8/2015 | Lee et al. | |
| 2015/0279487 A1 | 10/2015 | Pious et al. | |
| 2015/0325273 A1* | 11/2015 | Zhang | G11C 5/145 365/51 |
| 2015/0378887 A1 | 12/2015 | Lee et al. | |
| 2015/0380097 A1 | 12/2015 | Sato et al. | |
| 2016/0005476 A1 | 1/2016 | Park | |
| 2016/0048343 A1 | 2/2016 | Pekny et al. | |
| 2016/0078948 A1 | 3/2016 | Shirakawa | |
| 2016/0078959 A1 | 3/2016 | Bushnaq et al. | |
| 2016/0093392 A1 | 3/2016 | Sakamoto | |
| 2016/0093800 A1 | 3/2016 | Matsunami | |
| 2016/0125956 A1 | 5/2016 | Magia et al. | |
| 2016/0133329 A1* | 5/2016 | Moon | G11C 16/10 365/185.11 |
| 2016/0172034 A1 | 6/2016 | Oh et al. | |
| 2016/0179399 A1 | 6/2016 | Melik-Martirosian | |
| 2016/0180930 A1 | 6/2016 | Ogiwara et al. | |
| 2016/0180948 A1 | 6/2016 | Tanabe | |
| 2016/0180959 A1 | 6/2016 | Darragh et al. | |
| 2016/0232975 A1 | 8/2016 | Oh | |
| 2016/0260733 A1 | 9/2016 | Lue | |
| 2017/0054032 A1* | 2/2017 | Tsukamoto | H01L 27/11521 |
| 2017/0102877 A1 | 4/2017 | Afriat | |
| 2017/0221569 A1 | 8/2017 | Akamine et al. | |
| 2017/0242608 A1 | 8/2017 | Tailliet | |
| 2018/0068729 A1 | 3/2018 | Shirakawa et al. | |
| 2018/0143762 A1 | 5/2018 | Kim et al. | |
| 2018/0197586 A1 | 7/2018 | Nguyen et al. | |
| 2018/0226427 A1* | 8/2018 | Huang | H01L 28/00 |
| 2018/0261620 A1 | 9/2018 | Lee et al. | |
| 2018/0286921 A1 | 10/2018 | Redaelli et al. | |
| 2018/0299921 A1 | 10/2018 | Rajwani et al. | |
| 2018/0322094 A1 | 11/2018 | Friedman et al. | |
| 2018/0358102 A1 | 12/2018 | Zhang et al. | |
| 2019/0013063 A1 | 1/2019 | Liu et al. | |
| 2019/0043560 A1 | 2/2019 | Sumbul et al. | |
| 2019/0189229 A1 | 6/2019 | Lee | |
| 2019/0259462 A1 | 8/2019 | Lu et al. | |
| 2019/0378546 A1 | 12/2019 | Kim et al. | |
| 2019/0393268 A1 | 12/2019 | Lai et al. | |
| 2020/0105332 A1 | 4/2020 | Hamada et al. | |
| 2020/0135245 A1 | 4/2020 | McCombs | |
| 2020/0135758 A1* | 4/2020 | Park | G11C 16/26 |
| 2020/0143875 A1 | 5/2020 | Singh et al. | |
| 2020/0273522 A1 | 8/2020 | Shin et al. | |
| 2021/0158874 A1* | 5/2021 | Jang | G11C 16/26 |
| 2021/0249068 A1* | 8/2021 | Oh | G11C 11/4097 |
| 2022/0059164 A1* | 2/2022 | Takada | G06F 3/0659 |
| 2022/0093184 A1* | 3/2022 | Kim | H01L 25/18 |

FOREIGN PATENT DOCUMENTS

| | | |
|---|---|---|
| CN | 101506896 A | 8/2009 |
| CN | 101727979 A | 6/2010 |
| CN | 101819817 A | 9/2010 |
| CN | 101911202 A | 12/2010 |
| CN | 101933095 A | 12/2010 |
| CN | 102449701 A | 5/2012 |
| CN | 102467965 A | 5/2012 |
| CN | 102610260 A | 7/2012 |
| CN | 103137203 A | 6/2013 |
| CN | 103177764 A | 6/2013 |
| CN | 103632718 A | 3/2014 |
| CN | 103928054 A | 7/2014 |
| CN | 104584133 A | 4/2015 |
| CN | 104641418 A | 5/2015 |
| CN | 105304114 A | 2/2016 |
| KR | 1020160069705 A | 6/2016 |

* cited by examiner

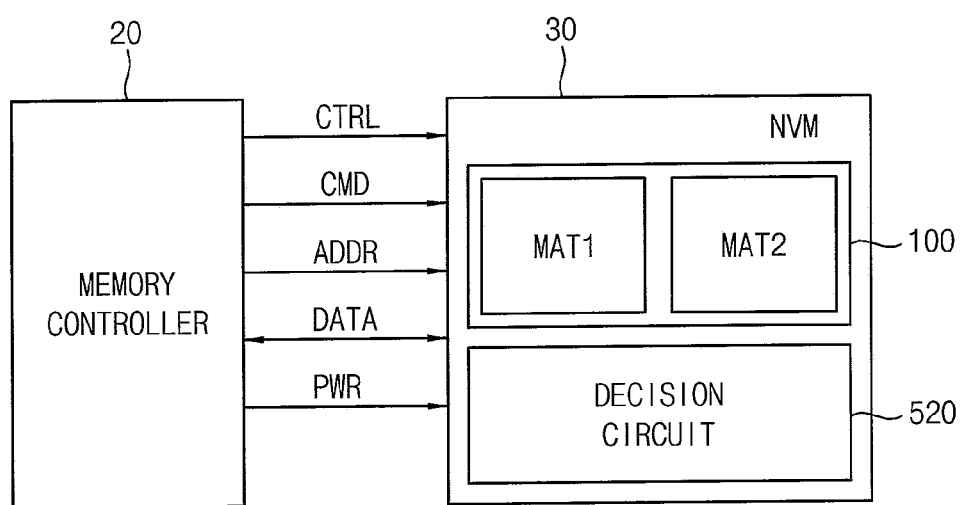

FIG. 15

| MODE / VOLTAGE | VOLTAGE LEVEL SETTING VALUE | | TIMING SETTING VALUE | |
|---|---|---|---|---|
| | SINGLE MAT | MULTI MAT | SINGLE MAT | MULTI MAT |
| VSSSL | 5.5V | 5.7V | 20us | 21us |
| PREP1 | 5.7V | 6.0V | 8us | 8.4us |
| PSTP1 | 5.5V | 5.8V | 6us | 6.5us |
| PREP2 | 5.3V | 5.5V | 8us | 8.2us |
| VR | 0.5V | 0.9V | 10us | 10.4us |
| PSTP2 | 5.0V | 5.4V | 6us | 6.4us |
| VRPASS | 6.0V | 6.5V | 20us | 21.5us |
| VPCH | 0.8V | 1.0V | 7us | 7.2us |
| VCMP | 0.7V | 0.9V | 6us | 6.4us |
| OD | 0.0V | 0.4V | 1.5us | 1.8us |

FIG. 17

| MODE<br>VOLTAGE | VOLTAGE LEVEL SETTING VALUE | | TIMING SETTING VALUE | |
|---|---|---|---|---|
| | SINGLE MAT | MULTI MAT | SINGLE MAT | MULTI MAT |
| VWSTP | 0V | 1V | 5us | 7us |
| VPGM | 19V | 20V | 10us | 12us |
| VPV | 1V | 1.2V | 15us | 17us |
| VPPASS1 | 8V | 9.5V | 4us | 4.5us |
| VPPASS2 | 10V | 12V | 8us | 10us |
| VVPASS | 8V | 9V | 20us | 22us |
| VBSTP | 2V | 2.2V | 17us | 19us |
| VPCH | 0.5V | 0.7V | 15us | 17us |
| OD | 0.2V | 0.3V | 2us | 2.5us |

NONVOLATILE MEMORY DEVICES

CROSS-REFERENCE TO RELATED APPLICATION

This U.S. Non-provisional application is a Continuation of U.S. patent application Ser. No. 16/991,693, filed on Aug. 12, 2020, U.S. Pat. No. 11,017,838, which is a continuation-in-part application of U.S. patent application Ser. No. 16/817,951 filed on Mar. 13, 2020, U.S. Pat. No. 10,777,254, which is a Continuation of U.S. patent application Ser. No. 16/675,331, filed on Nov. 6, 2019, U.S. Pat. No. 10,672,454, which is a Continuation of U.S. patent application Ser. No. 16/183,315, filed on Nov. 7, 2018, U.S. Pat. No. 10,629,254, which is a Divisional Application of U.S. patent application Ser. No. 15/604,406 filed on May 24, 2017, U.S. Pat. No. 10,153,029, which claims priority under 35 USC § 119 to Korean Patent Application No. 10-2016-0099219, filed on Aug. 4, 2016, in the Korean Intellectual Property Office (KIPO), the disclosure of each of which is incorporated herein by reference in its entirety.

BACKGROUND

1. Technical Field

Exemplary embodiments relate generally to semiconductor memory devices, and more particularly to nonvolatile memory devices and memory systems.

2. Discussion of the Related Art

Semiconductor memory devices may be typically classified into volatile semiconductor memory devices and nonvolatile semiconductor memory devices. Volatile semiconductor memory devices may perform read and write operations at a high speed, while contents stored therein may be lost when the devices are powered-off. Nonvolatile semiconductor memory devices may retain contents stored therein even when powered-off. For this reason, nonvolatile semiconductor memory devices may be used to store contents to be retained regardless of whether the devices are powered on or off.

Nonvolatile semiconductor memory devices may include a mask read-only memory (MROM), a programmable ROM (PROM), an erasable programmable ROM (EPROM), an electrically erasable programmable ROM (EEPROM), etc.

A flash memory device may be a typical nonvolatile memory device. A flash memory device may be widely used as the voice and image storing media of electronic apparatuses such as a computer, a cellular phone, a PDA, a digital camera, a camcorder, a voice recorder, an MP3 player, a handheld PC, a game machine, a facsimile, a scanner, a printer, etc. For improving the performance of read/write operation of flash memory devices, flash memory devices may operate in a multi-mat mode. However, it is desired to reduce a load of word-lines or bit-lines of the flash memory devices operating in the multi-mat mode.

SUMMARY

Some exemplary embodiments are directed to a nonvolatile memory device, capable of enhancing performance.

Some exemplary embodiments are directed to provide a memory system, capable of enhancing performance.

According to exemplary embodiments, a nonvolatile memory device includes a memory cell array and a row decoder. The memory cell array includes a plurality of mats, and each of the plurality mats includes a plurality of cell strings. A first cell string of a first mat is connected to a plurality of first word-lines, a first bit-line and a first string selection line. A second cell string of a second mat is connected to a plurality of second word-lines, a second bit-line and a second string selection line. Each of the first and second cell strings includes at least one ground selection transistor, a plurality of memory cells, and at least one string selection transistor coupled in series. The row decoder connected to the plurality of first and second word-lines and the first and second string selection lines, applies corresponding word-line voltages to the plurality of first and second word-lines. The row decoder applies a first voltage to a third word-line among the plurality of first and second word-lines for a first period of time when a first operation of the nonvolatile memory device is performed for only one of the first and second mats and to apply a second voltage to the third word-line for a second period of time when the first operation is performed for both of the first and second mats simultaneously, and the second period of time is longer than the first period of time.

According to exemplary embodiments, a nonvolatile memory device includes a memory cell region including a first metal pad, a peripheral circuit region including a second metal pad and vertically connected to the memory cell region by the first metal pad and the second metal pad, a memory cell array in the memory cell region and a row decoder in the peripheral circuit region. The memory cell array includes a plurality of mats, and each of the plurality mats includes a plurality of cell strings. A first cell string of a first mat is connected to a plurality of first word-lines, a first bit-line and a first string selection line. A second cell string of a second mat is connected to a plurality of second word-lines, a second bit-line and a second string selection line. Each of the first and second cell strings includes at least one ground selection transistor, a plurality of memory cells, and at least one string selection transistor coupled in series. The row decoder connected to the plurality of first and second word-lines, the first and second string selection lines, applies corresponding word-line voltages to the plurality of first and second word-lines. The row decoder applies a first voltage to a third word-line among the plurality of first and second word-lines for a first period of time when a first operation of the nonvolatile memory device is performed for only one of the first and second mats and to apply a second voltage to the third word-line for a second period of time when the first operation is performed for both of the first and second mats simultaneously, and the second period of time is different from the first period of time.

Accordingly, in a nonvolatile memory device according to exemplary embodiments, levels or application time intervals of the voltages applied to the memory cell array are differentiated in a single mat mode and a multi-mat mode, and performance in both the single mat mode and the multi-mat mode may be enhanced.

BRIEF DESCRIPTION OF THE DRAWINGS

Illustrative, non-limiting exemplary embodiments will be more clearly understood from the following detailed description in conjunction with the accompanying drawings.

FIG. 1 is a block diagram illustrating a memory system according to exemplary embodiments.

FIG. 2 is a table illustrating control signals in the memory system of FIG. 1.

FIG. 15 is a table illustrating setting values of levels and application time interval of the word-line voltages and the bit-line voltages applied to the first second mats in FIGS. 13 and 14 when a read operation is performed on the nonvolatile memory device of FIG. 3., according to exemplary embodiments

FIG. 17 is a table illustrating setting values of levels and application time interval of the word-line voltages and the bit-line voltages applied to the first second mats in FIG. 16 when the program operation is performed on the nonvolatile memory device of FIG. 3, according to exemplary embodiments.

DETAILED DESCRIPTION OF THE EMBODIMENTS

Figure 3:
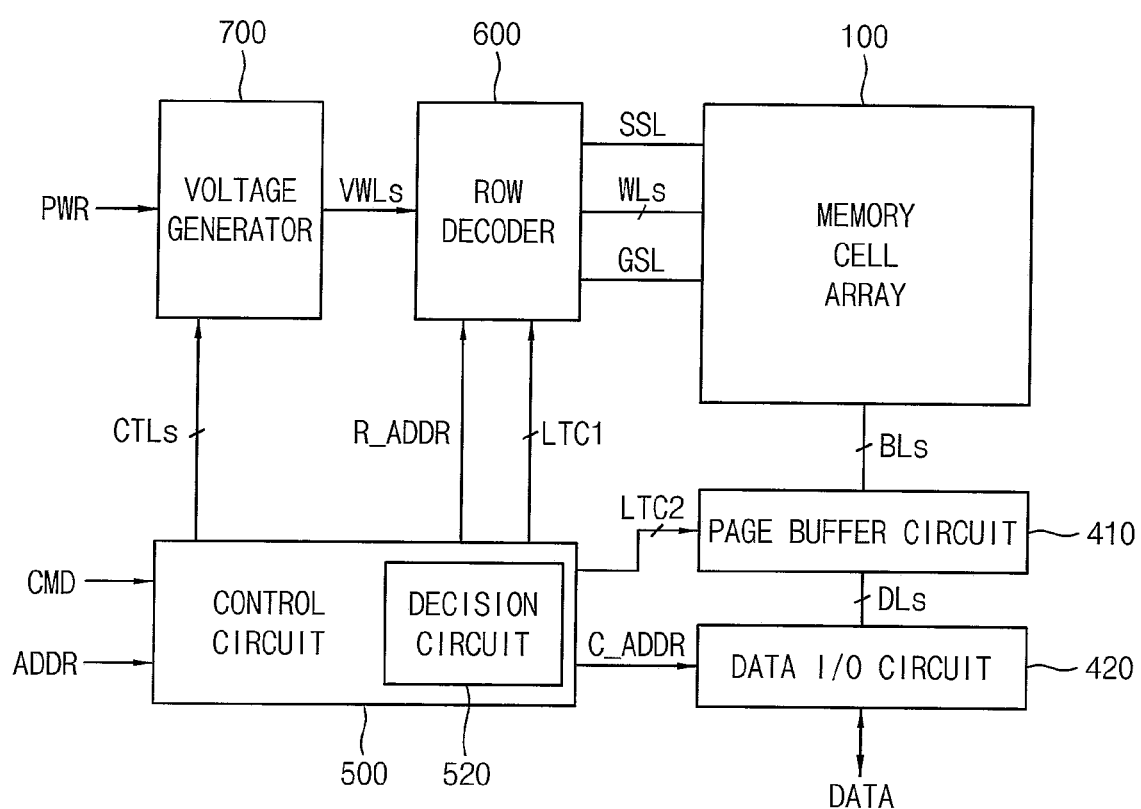
FIG. 3 is a block diagram illustrating the nonvolatile memory device in the memory system of FIG. 1 according to exemplary embodiments.

Various exemplary embodiments will be described more fully hereinafter with reference to the accompanying drawings, in which some exemplary embodiments are shown.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items. Expressions such as that, although the terms first, second, third etc. may be used herein to describe various elements, these elements should elements of the list.

Expressions such as "at least one of," when preceding a list of elements, modify the entire list of elements and do not modify the individual elements of the list.

FIG. 1 is a block diagram illustrating a memory system according to exemplary embodiments.

Referring to FIG. 1, a memory system (or, a nonvolatile memory system) 10 may include a memory controller 20 and at least one nonvolatile memory device 30.

The memory system 10 may include data storage media based flash memory such as a memory card, a universal serial bus (USB) memory and solid state drive (SSD).

The nonvolatile memory device 30 may perform a read operation, an erase operation, and a program operation or a write operation under control of the memory controller 20. The nonvolatile memory device 30 receives a command CMD, an address ADDR and data DATA through input/output lines from the memory controller 20 for performing such operations. In addition, the nonvolatile memory device 30 receives a control signal CTRL through a control line from the memory controller 20. The nonvolatile memory device 30 receives a power PWR through a power line from the memory controller 20.

The nonvolatile memory device 30 may include a memory cell array 100 and a decision circuit 520. The memory cell array 100 may include at least a first mat MAT1 and a second mat MAT2. Each of the first mat MAT1 and the second mat MAT2 may include a plurality of memory blocks. Each block of the plurality of memory blocks may include a plurality of strings each string including a plurality of transistors connected to a plurality of word-lines and a plurality of bit-lines. The first mat MAT1 may be referred to as a first plane PLANE1 and the second mat MAT2 may be referred to as a second plane PLANE2. The decision circuit 520 may determine one of a single mat mode and a multi-mat mode of the first mat MAT1 and the second mat MAT2.

FIG. 2 is a table illustrating control signals in the memory system of FIG. 1.

Referring to FIGS. 1 and 2, the control signal CTRL, which the memory controller 20 applies to the nonvolatile memory device 30, may include, a command latch enable signal CLE, an address latch enable signal ALE, a chip enable signal nCE, a read enable signal nRE, and a write enable signal nWE.

The memory controller 20 may transmit the command latch enable signal CLE to the nonvolatile memory device 30. For example, the memory controller 20 may transmit the command latch enable signal CLE to the nonvolatile memory device 30 via a separately assigned control pin. The command latch enable signal CLE may be a signal indicating that information transferred via the input/output lines is a command.

The memory controller 20 may transmit the address latch enable signal ALE to the nonvolatile memory device 30. The memory controller 20 may transmit the address latch enable signal ALE to the nonvolatile memory device 30 via a separately assigned control pin. The address latch enable signal ALE may be a signal indicating that information transferred via the input/output lines is an address.

The memory controller 20 may transmit the chip enable signal nCE to the nonvolatile memory device 30. The memory controller 20 may transmit the chip enable signal nCE to the nonvolatile memory device 30 via a separately assigned control pin. The chip enable signal nCE may indicate a memory chip selected from among a plurality of memory chips when the nonvolatile memory device includes the plurality of memory chips. For example, the chip enable signal nCE may include one or more chip enable signals nCEs.

The memory controller 20 may transmit the read enable signal nRE to the nonvolatile memory device 30. The memory controller 20 may transmit the read enable signal nRE to the nonvolatile memory device 30 via a separately assigned control pin. The nonvolatile memory device 30 may transmit read data to the memory controller 20 based on the read enable signal nRE.

The memory controller 20 may transmit the write enable signal nWE to the nonvolatile memory device 30. The memory controller 20 may transmit the write enable signal nWE to the nonvolatile memory device 30 via a separately assigned control pin. When the write enable signal nWE is activated, the nonvolatile memory device 30 may store data input signals provided from the memory controller 20 to the memory cell array 100 of the nonvolatile memory device 30.

FIG. 3 is a block diagram illustrating the nonvolatile memory device in the memory system of FIG. 1 according to exemplary embodiments.

Referring to FIG. 3, the nonvolatile memory device 30 includes a memory cell array 100, a row decoder 600, a page buffer circuit 410, a data input/output circuit 420, a control circuit 500, and a voltage generator 700 (e.g., a word-line voltage generator). The control circuit 500 may include the decision circuit 520.

The memory cell array 100 may be coupled to the row decoder 600 through a string selection line SSL, a plurality of word-lines WLs, and a ground selection line GSL. In addition, the memory cell array 100 may be coupled to the page buffer circuit 410 through a plurality of bit-lines BLs.

The memory cell array 100 may include a plurality of memory cells coupled to the plurality of word-lines WLs and the plurality of bit-lines BLs.

In some exemplary embodiments, the memory cell array 100 may be a three-dimensional memory cell array, which is formed on a substrate in a three-dimensional structure (or a vertical structure). In this case, the memory cell array 100 may include vertical cell strings that are vertically oriented such that at least one memory cell is located over another memory cell. The following patent documents, which are hereby incorporated by reference, describe suitable configurations for three-dimensional memory cell arrays: U.S. Pat. Nos. 7,679,133; 8,553,466; 8,654,587; 8,559,235; and US Pat. Pub. No. 2011/0233648.

In other exemplary embodiments, the memory cell array 100 may be a two-dimensional memory cell array, which is formed on a substrate in a two-dimensional structure (or a horizontal structure).

Referring still to FIG. 3, the row decoder 600 may select at least one of a plurality of memory blocks of the plurality of mats of the cell array 100 in response to an address ADDR from the memory controller 20. For example, the row decoder 600 may select at least one of a plurality of word-lines in the selected one or more memory blocks. The row decoder 600 may transfer a voltage (e.g., a word-line voltage) generated from the voltage generator 700 to a selected word-line. At a program operation, the row decoder 600 may transfer a program voltage or a verification voltage to a selected word-line and a pass voltage to an unselected word-line. At a read operation, the row decoder 600 may transfer a selection read voltage to a selected word-line and a non-selection read voltage to an unselected word-line.

The page buffer circuit 410 may operate as a write driver at a program operation and a sense amplifier at a read operation. At a program operation, the page buffer circuit 410 may provide a bit-line of the memory cell array 100 with a bit-line voltage corresponding to data to be programmed. At a read or verification read operation, the page buffer circuit 410 may sense data stored in a selected memory cell via a bit-line. The page buffer circuit 410 may include a plurality of page buffers PB1 to PBn each connected with one bit-line or two bit-lines.

The control circuit 500 may generate a plurality of control signals CTLs, a first control signal LTC1, and a second control signal LTC2 based on the command signal CMD. The control circuit 500 may also generate a row address R_ADDR and a column address C_ADDR based on the address signal ADDR. A detailed description for the control circuit 500 will be described later.

In example embodiments, the nonvolatile memory device 30 may further include a voltage generator (not shown) for supplying a variable voltage to a selected bit-line of the memory cell array 100 through the page buffer circuit 410. In other example embodiments, the page buffer circuit 410 may include the voltage generator (not shown) applying a variable voltage to a selected bit-line of the memory cell array 100.

Figure 4:
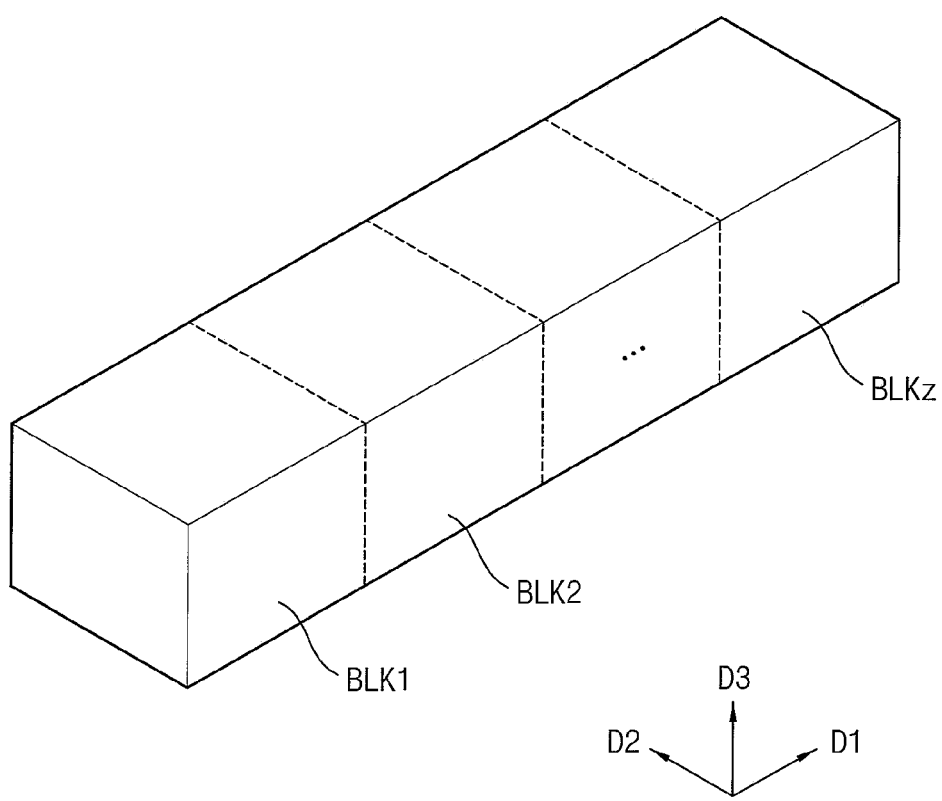
FIG. 4 is a block diagram illustrating the memory cell array in FIG. 3 according to exemplary embodiments.

FIG. 4 is a block diagram illustrating the memory cell array in FIG. 3 according to exemplary embodiments.

Referring to FIG. 4, the memory cell array 100 may include a plurality of memory blocks BLK1 to BLKz which extend in a plurality of directions D1, D2 and D3. In particular, each of the first mat MAT1 (or the first plane PLANE1) and the second mat MAT2 (or the second plane PLANE2) may include the plurality of memory blocks BLK1 to BLKz. In an embodiment, the memory blocks BLK1 to BLKz are selected by the row decoder 600 in FIG. 3. For one example, the row decoder 600 may select a particular memory block BLK corresponding to a block address among the memory blocks BLK1 to BLKz of one of the first and second mats MAT1 and MAT2. For another example, the row decoder 600 may select two particular memory blocks BLKs corresponding to a block address among the memory blocks BLK1 to BLKz of each of the first and second mats MAT1 and MAT2.

Figure 5:
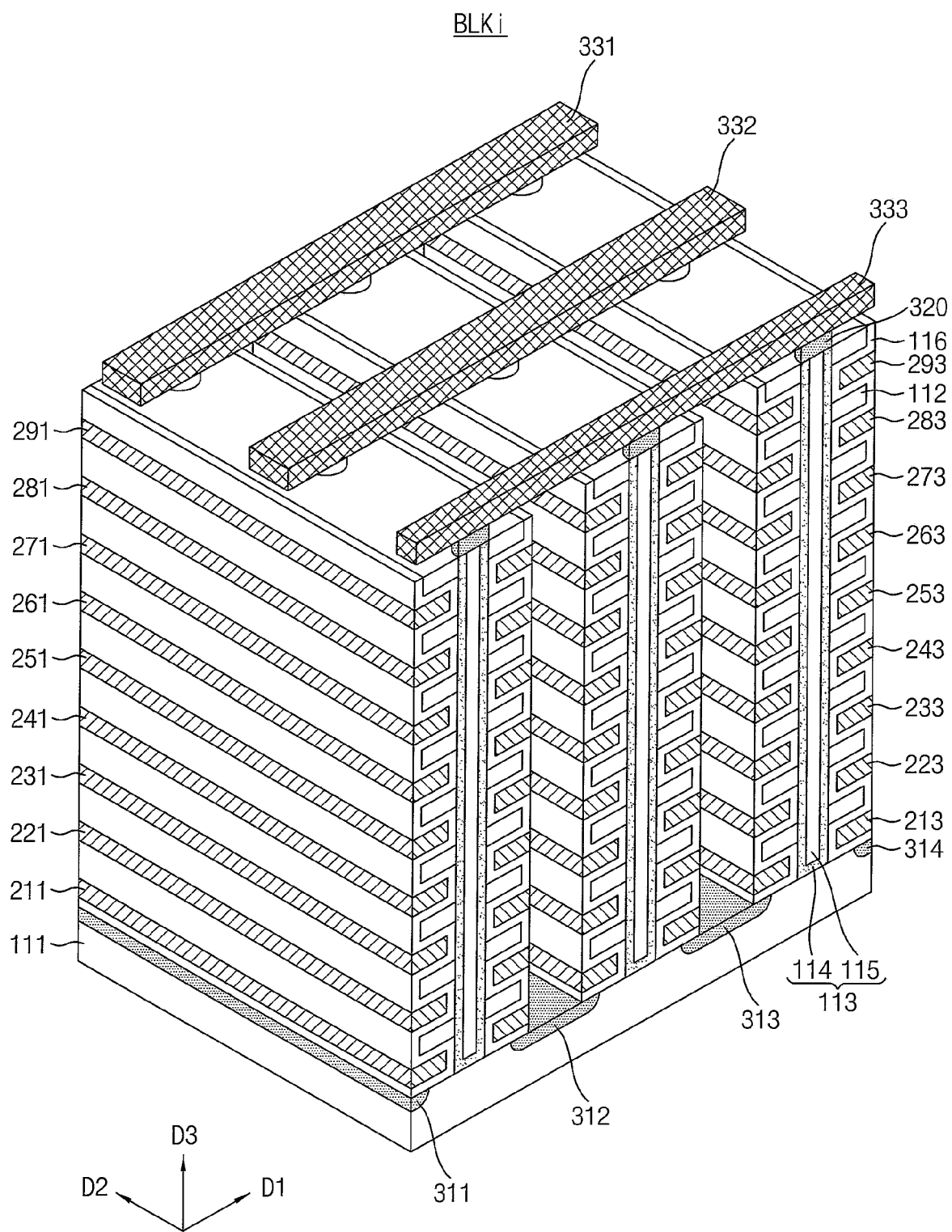
FIG. 5 is a perspective view illustrating one of the memory blocks of FIG. 4 according to exemplary embodiments.

FIG. 5 is a perspective view illustrating one of the memory blocks of FIG. 4 according to exemplary embodiments.

Referring to FIG. 5, a memory block BLKi includes structures extending along the first to third directions D1~D3.

A substrate 111 is provided. For example, the substrate 111 may have a well of a first type (e.g., a first conductive type). For example, the substrate 111 may have a p-well formed by implanting a group 3 element such as boron (B). For example, the substrate 111 may have a pocket p-well provided in an n-well. In an embodiment, the substrate 111 has a p-type well (or a p-type pocket well). However, the conductive type of the substrate 111 is not limited to the p-type.

A plurality of doping regions 311 to 314 extending along the first direction D1 are provided in/on the substrate 111. For example, the plurality of doping regions 311 to 314 may have a second type (e.g., a second conductive type) different from the first type of the substrate 111. In an embodiment, the first to fourth doping regions 311 to 314 have an n-type. However, the conductive type of the first to fourth doping regions 311 to 314 is not limited to the n-type.

A plurality of insulation materials 112 extending along the second direction D2 are sequentially provided along the third direction D3 on a region of the substrate 111 between the first and second doping regions 311 and 312. For example, the plurality of insulation materials 112 are provided along the third direction D3, being spaced by a specific distance. Exemplarily, the insulation materials 112 may include an insulation material such as an oxide layer.

A plurality of pillars 113 penetrating the insulation materials along the third direction D3 are sequentially disposed along the second direction D2 on a region of the substrate 111 between the first and second doping regions 311 and 312. For example, the plurality of pillars 113 penetrate the insulation materials 112 to contact the substrate 111.

For example, each pillar 113 may include a plurality of materials. For example, a channel layer 114 of each pillar 113 may include a silicon material having a first type. For example, the channel layer 114 of each pillar 113 may include a silicon material having the same type as the substrate 111. In an embodiment, the channel layer 114 of each pillar 113 includes a p-type silicon. However, the channel layer 114 of each pillar 113 is not limited to the p-type silicon.

An internal material 115 of each pillar 113 includes an insulation material. For example, the internal material 115 of each pillar 113 may include an insulation material such as a silicon oxide. For example, the inner material 115 of each pillar 113 may include an air gap.

An insulation layer 116 is provided along the exposed surfaces of the insulation materials 112, the pillars 113, and the substrate 111, on a region between the first and second doping regions 311 and 312. Exemplarily, the insulation layer 116 provided on the exposed surface in the third direction D3 of the last insulation material 112 may be removed.

A plurality of first conductive materials 211 to 291 is provided between second doping regions 311 and 312 on the exposed surfaces of the insulation layer 116. For example, the first conductive material 211 extending along the second direction D2 is provided between the substrate 111 and the insulation material 112 adjacent to the substrate 111.

A first conductive material extending along the first direction D1 is provided between the insulation layer 116 at the top of a specific insulation material among the insulation materials 112 and the insulation layer 116 at the bottom of a specific insulation material among the insulation materials 112. For example, a plurality of first conductive materials 221 to 281 extending along the first direction D1 are provided between the insulation materials 112 and it may be understood that the insulation layer 116 is provided between the insulation materials 112 and the first conductive materials 221 to 281. The first conductive materials 211 to 291 may include a metal material. The first conductive materials 211 to 291 may include a conductive material such as a polysilicon.

The same structures as those on the first and second doping regions 311 and 312 may be provided in a region between the second and third doping regions 312 and 313. In the region between the second and third doping regions 312 and 313, provided are a plurality of insulation materials 112 extending along the first direction D1, a plurality of pillars 113 disposed sequentially along the first direction D1 and penetrating the plurality of insulation materials 112 along the third direction D3, an insulation layer 116 provided on the exposed surfaces of the plurality of insulation materials 112 and the plurality of pillars 113, and a plurality of conductive materials 213 to 293 extending along the first direction D1.

In a region between the third and fourth doping regions 313 and 314, the same structures as those on the first and second doping regions 311 and 312 may be provided. In the region between the third and fourth doping regions 313 and 314, provided are a plurality of insulation materials 112 extending along the first direction D1, a plurality of pillars 113 disposed sequentially along the first direction D1 and penetrating the plurality of insulation materials 112 along the third direction D3, an insulation layer 116 provided on the exposed surfaces of the plurality of insulation materials 112 and the plurality of pillars 113, and a plurality of first conductive materials 213 to 293 extending along the first direction D1.

Drains 320 are provided on the plurality of pillars 113, respectively. The drains 320 may include silicon materials doped with a second type. For example, the drains 320 may include silicon materials doped with an n-type. In an embodiment, the drains 320 include n-type silicon materials. However, the drains 320 are not limited to the n-type silicon materials.

On the drains, the second conductive materials 331 to 333 extending along the first direction D1 are provided. The second conductive materials 331 to 333 are disposed along the second direction D2, being spaced by a specific distance. The second conductive materials 331 to 333 are respectively connected to the drains 320 in a corresponding region. The drains 320 and the second conductive material 333 extending along the first direction D1 may be connected through each contact plug. The second conductive materials 331 to 333 may include metal materials. The second conductive materials 331 to 333 may include conductive materials such as a polysilicon.

In example embodiments, each of the first conductive materials 211 to 291 may form a word-line or a selection line SSL/GSL. The first conductive materials 221 to 281 may be used as word-lines, and first conductive materials formed at the same layer may be interconnected. The memory block BLKi may be selected when the first conductive materials 211 to 291 all are selected. On the other hand, a sub-block may be selected by selecting a part of the first conductive materials 211 to 291.

The number of layers at which first conductive materials 211 to 291 are formed may not be limited to this disclosure. It is well understood that the number of layers at which the first conductive materials 211 to 291 are formed is changed according to a process technique and a control technique.

In example embodiments, each of the second conductive materials 331 to 333 may form a bit-line and each of the doping regions 311 to 314 may form a common source line of the cell strings.

Figure 6:
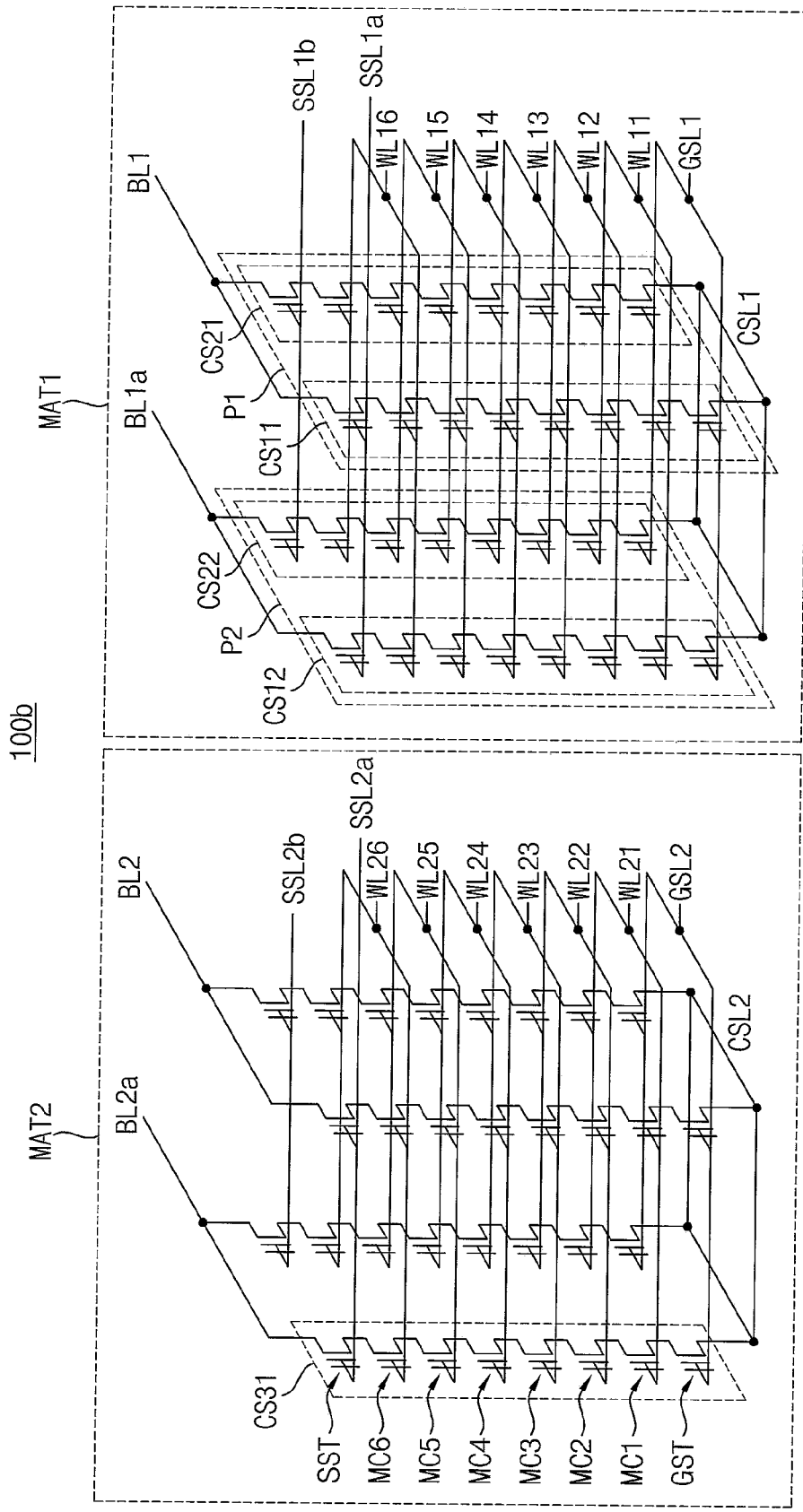
FIG. 6 is a circuit diagram illustrating a mat configuration in the nonvolatile memory device of FIG. 3 according to exemplary embodiments.

FIG. 6 is a circuit diagram illustrating a mat configuration in the nonvolatile memory device of FIG. 3 according to exemplary embodiments.

Referring to FIG. 6, a memory cell array 100b including first and second mats MAT1 and MAT2 is illustrated. Each of the first and second mats MAT1 and MAT2 includes a plurality of memory blocks, and each of the memory blocks includes a plurality of cell strings. For example, a memory block of the first mat MAT1 includes a plurality of cell strings CS11, CS12, CS21, and CS22. The plurality of cell strings in a mat may be formed in a plane. Each of the first and second mats MAT1 and MAT2 includes a plurality of memory blocks, and one of the memory blocks has multiple string selection lines SSL1a and SSL1b to select at least one of the cell strings CS11, CS12, CS21, and CS22. For example, when a selection voltage is applied to a first string selection line SSL1a, the first and second cell strings CS11 and CS12 may be selected. When a selection voltage is applied to a second string selection line SSL1b, third and fourth cell strings CS21 and CS22 may be selected.

In some embodiments, the first and second mats MAT1 and MAT2 may have the same physical structure. For example, like the first mat MAT1, the second mat MAT2 may include multiple memory blocks and multiple cell strings formed in a memory block of the multiple memory blocks. Also, the second mat MAT2 may include multiple string selection lines SSL2a and SSL2b to select at least one of multiple cell strings.

Each of the first and second mats MAT1 and MAT2 may be coupled to corresponding word-lines and a common source line. The cell strings in the first mat MAT1 may be coupled to word-lines WL11~WL16, a ground selection line GSL1 and a common source line CSL1. The cell strings in the second mat MAT2 may be coupled to word-lines WL21~WL26, a ground selection line GSL2 and a common source line CSL2.

The first and second mats MAT1 and MAT2 do not share bit-lines. First bit-lines BL1 and BL1a are coupled to the first mat MAT1 exclusively. Second bit-lines BL2 and BL2a are coupled to the second mat MAT2 exclusively.

Although FIG. 6 illustrates an example in which each mat is connected with two bit-lines and six word-lines, the inventive concept is not limited to these features. For example, each mat can be connected with three or more bit-lines and seven or more word-lines.

Each cell string may include at least one string selection transistor, memory cells, and at least one ground selection transistor. For example, a cell string CS31 of the second mat MAT2 may include a ground selection transistor GST, multiple memory cells MC1 to MC6, and a string selection transistor SST sequentially being perpendicular to a substrate. The remaining cell strings may be formed substantially the same as the cell string CS31.

The first and second mats MAT1 and MAT2 include independent string selection lines. For example, string selection lines SSL1a and SSL1b are only connected with the first mat MAT1, and string selection lines SSL2a and SSL2b are only connected with the second mat MAT2. A string selection line may be used to select cell strings only in a mat. Also, cell strings may be independently selected in every mat by controlling the string selection lines independently.

For example, cell strings CS11 and CS12 may be independently selected by applying a selection voltage only to first string selection line SSL1a. When the selection voltage is applied to first string selection line SSL1a, string selection transistors of cell strings CS11 and CS12 corresponding to first string selection line SSL1a may be turned on by the selection voltage. In this case, memory cells of the cell strings CS11 and CS12 may be electrically connected with a bit-line. When a non-selection voltage is applied to first string selection line SSL1a, string selection transistors of cell strings CS11 and CS12 corresponding to first string selection line SSL1a are turned off by the non-selection voltage. In this case, memory cells of the cell strings CS11 and CS12 are electrically isolated from a bit-line.

Referring back to FIG. 3, the control circuit 500 may receive a command (signal) CMD and an address (signal) ADDR from the memory controller 20 and control an erase loop, a program loop and a read operation of the nonvolatile memory device 30 based on the command signal CMD and the address signal ADDR. The program loop may include a program operation and a program verification operation. The erase loop may include an erase operation and an erase verification operation.

In example embodiments, the control circuit 500 may generate the control signals CTLs, which are used for controlling the voltage generator 700, may generate the first control signal LTC1 for controlling the row decoder 600 and may generate the second control signal LTC2 for controlling the page buffer circuit 410, based on the command signal CMD. The control circuit 500 may generate the row address R_ADDR and the column address C_ADDR based on the address signal ADDR. The control circuit 500 may provide the row address R_ADDR to the row decoder 600 and provide the column address C_ADDR to the data input/output circuit 420. The control circuit 500 may include the decision circuit 520 to determine an operation mode based on a number of mats which operate simultaneously. A concept of plane may be used instead of a concept of the mat.

The row decoder 600 may be coupled to the memory cell array 100 through the string selection line SSL, the plurality of word-lines WLs, and the ground selection line GSL. During the program operation or the read operation, the row decoder 600 may determine one of the plurality of word-lines WLs as the selected word-line and determine rest of the plurality of word-lines WLs except for the selected word-line as unselected word-lines based on the row address R_ADDR.

The voltage generator 700 may generate word-line voltages VWLs, which are required for the operation of the memory cell array 100 of the nonvolatile memory device 30, based on the control signals CTLs. The voltage generator 700 may receive the power PWR from the memory controller 20. The word-line voltages VWLs may be applied to the plurality of word-lines WLs through the row decoder 600.

For example, during the erase operation, the voltage generator 700 may apply an erase voltage to a well of a memory block and may apply a ground voltage to entire word-lines of the memory block. During the erase verification operation, the voltage generator 700 may apply an erase verification voltage to the entire word-lines of the memory block or sequentially apply the erase verification voltage to word-lines in a word-line basis.

For example, during the program operation, the voltage generator 700 may apply a program voltage to the selected word-line and may apply a program pass voltage to the unselected word-lines. In addition, during the program verification operation, the voltage generator 700 may apply a program verification voltage to the selected word-line and may apply a verification pass voltage to the unselected word-lines.

In addition, during the read operation, the voltage generator 700 may apply a read voltage to the selected word-line and may apply a read pass voltage to the unselected word-lines.

The page buffer circuit 410 may be coupled to the memory cell array 100 through the plurality of bit-lines BLs. The page buffer circuit 410 may include a plurality of page buffers. In some exemplary embodiments, one page buffer may be connected to one bit-line. In other exemplary embodiments, one page buffer may be connected to two or more bit-lines.

The page buffer circuit 410 may temporarily store data to be programmed in a selected page or data read out from the selected page of the memory cell array 100.

The data input/output circuit 420 may be coupled to the page buffer circuit 410 through data lines DLs. During the program operation, the data input/output circuit 410 may receive program data DATA from the memory controller 20 and provide the program data DATA to the page buffer circuit 410 based on the column address C_ADDR received from the control circuit 500. During the read operation, the data input/output circuit 420 may provide read data DATA, which are stored in the page buffer circuit 410, to the memory controller 20 based on the column address C_ADDR received from the control circuit 500.

In addition, the page buffer circuit 410 and the data input/output circuit 420 read data from a first area of the memory cell array 100 and write the read data to a second area of the memory cell array 100. That is, the page buffer circuit 410 and the data input/output circuit 420 may perform a copy-back operation.

Figure 7:
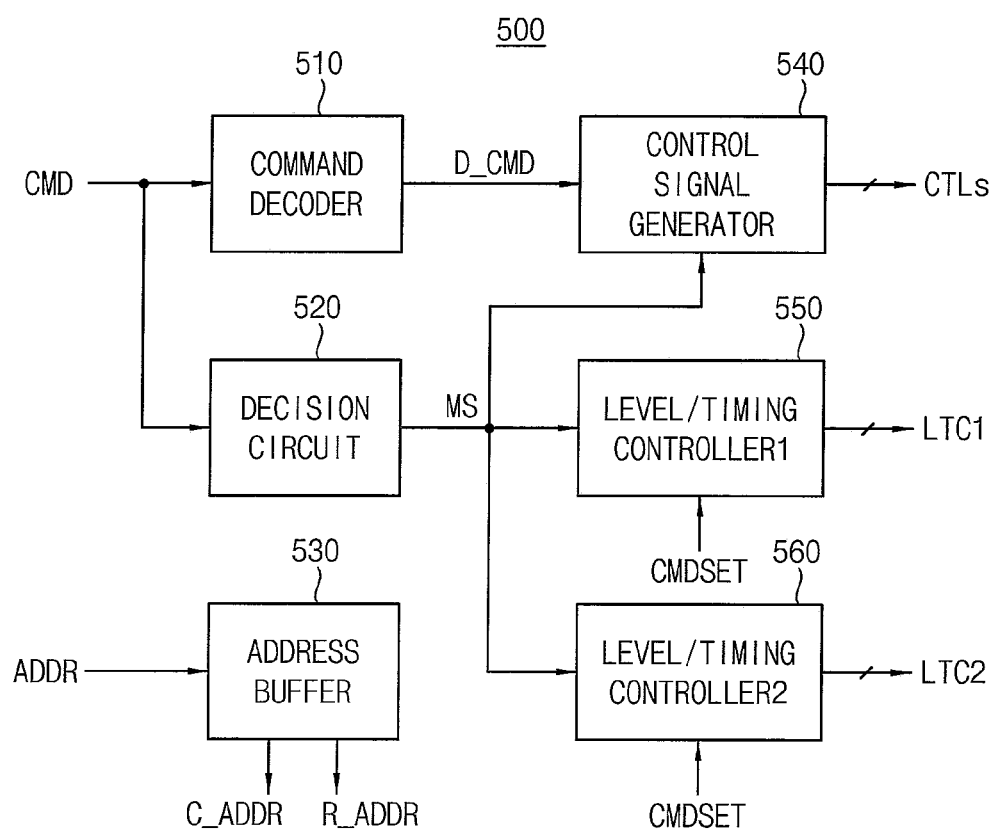
FIG. 7 is a block diagram illustrating the control circuit in the nonvolatile memory device of FIG. 3 according to exemplary embodiments.

FIG. 7 is a block diagram illustrating the control circuit in the nonvolatile memory device of FIG. 3 according to exemplary embodiments.

Referring to FIG. 7, the control circuit 500 includes a command decoder 510, a decision circuit 520, an address buffer 530, a control signal generator 540, a first level/timing controller 550 and a second level/timing controller 560.

The command decoder 510 decodes the command CMD and provides a decoded command D_CMD to the control signal generator 540. The address buffer 530 receives the address signal ADDR, provides the row address R_ADDR to the row decoder 600 and provides the column address C_ADDR to the data input/output circuit 420.

The decision circuit 520 receives the command CMD and generates a mode signal MS designating one of a single mat mode and a multi-mat mode in response to the command CMD.

An operation of the nonvolatile memory device is performed on one of the plurality of mats in the single mat mode, and an operation of the nonvolatile memory device is simultaneously performed on at least two mats of the plurality of mats in the multi-mat mode. The single mat mode may be also referred to as a single plane mode or a single speed mode. The multi-mat mode may be also referred to as a multi-plane mode or a multi-speed mode. The decision circuit 520 provides the mode signal MS to the control signal generator 540, the first level/timing controller 550 and the second level/timing controller 560.

The control signal generator 540 receives the decoded command D_CMD and the mode signal MS, generates the control signals CTLs based on an operation directed by the decoded command D_CMD and an operation mode directed by the mode signal MS and provides the control signals CTLs to the voltage generator 700.

The first level/timing controller 550 receives the mode signal MS, generates the first control signal LTC1 based on the mode designated by the mode signal MS, provides the first control signal LTC1 to the row decoder 600. The first level/timing controller 550 receives setting information on levels of the word-line voltages and application time interval of the word-line voltages for the single mat mode and the multi-mat mode as a command set CMDSET from the memory controller 20 and stores the command set CMDSET therein. The first level/timing controller 550 provides the row decoder 600 with the first control signal LTC1 indicating the setting information of the word-line voltages in response to the mode signal MS.

The second level/timing controller 560 receives the mode signal MS, generates the second control signal LTC2 based on the mode designated by the mode signal MS, provides the second control signal LTC2 to the page buffer circuit 410. The second level/timing controller 560 receives setting information on levels of voltages applied to the bit-lines (i.e., bit-line voltages) and application time interval of the bit-line voltages for the single mat mode and the multi-mat mode as the command set CMDSET from the memory controller 20 and stores the command set CMDSET therein. The second level/timing controller 560 provides the page buffer circuit 410 with the second control signal LTC2 indicating the setting information of the bit-line voltages in response to the mode signal MS.

Figure 8:
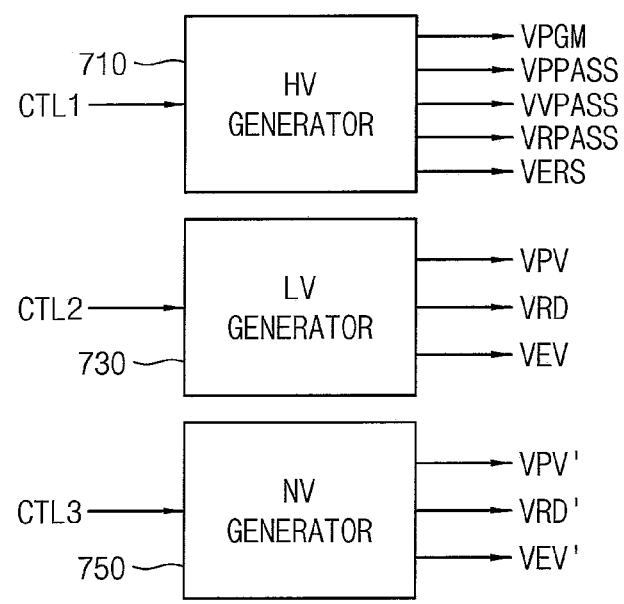
FIG. 8 is a block diagram illustrating the voltage generator in the nonvolatile memory device of FIG. 3 according to exemplary embodiments.

FIG. 8 is a block diagram illustrating the voltage generator in the nonvolatile memory device of FIG. 3 according to exemplary embodiments.

Referring to FIG. 8, the voltage generator 700 may include a high voltage generator 710 and a low voltage generator 730. The voltage generator 700 may further include a negative voltage generator 750.

The high voltage generator 710 may generate a program voltage VPGM, a program pass voltage VPPASS, a verification pass voltage VVPASS, a read pass voltage VRPASS and an erase voltage VERS according to operations directed by the decoded command D_CMD, in response to a first control signal CTL1 of the control signals CTLs.

Levels of the program voltage VPGM, the program pass voltage VPPASS, the verification pass voltage VVPASS, the read pass voltage VRPASS may be different in the single mat mode and the multi-mat mode. The program voltage VPGM is applied to the selected word-line, the program pass voltage VPPASS, the verification pass voltage VVPASS, the read pass voltage VRPASS may be applied to the unselected word-lines and the erase voltage VERS may be applied to the well of the memory block. The first control signal CTL1 may include a plurality of bits which indicate the operations directed by the decoded command D_CMD and the mode designated by the mode signal MS.

The low voltage generator 730 may generate a program verification voltage VPV, a read voltage VRD and an erase verification voltage VEV according to operations directed by the decoded command D_CMD, in response to a second control signal CTL2 of the control signals CTLs. Levels of the program verification voltage VPV, the read voltage VRD and the erase verification voltage VEV may be different in the single mat mode and the multi-mat mode. The program verification voltage VPV, the read voltage VRD and the erase verification voltage VEV may be applied to the selected word-line according to operation of the nonvolatile memory device 30. The second control signal CTL2 may include a plurality of bits which indicate the operations directed by the decoded command D_CMD and the mode designated by the mode signal MS.

The negative voltage generator 750 may generate a program verification voltage VPV', a read voltage VRD' and an erase verification voltage VEV' which have negative levels according to operations directed by the decoded command D_CMD, in response to a third control signal CTL3 of the control signals CTLs. Levels of the program verification voltage VPV', the read voltage VRD' and the erase verification voltage VEV' may be different in the single mat mode and the multi-mat mode. The third control signal CTL3 may include a plurality of bits which indicate the operations directed by the decoded command D_CMD and the mode designated by the mode signal MS.

Although not illustrated, the voltage generator 700 may generate other voltages that will be described in FIGS. 15 and 17.

Figure 9:
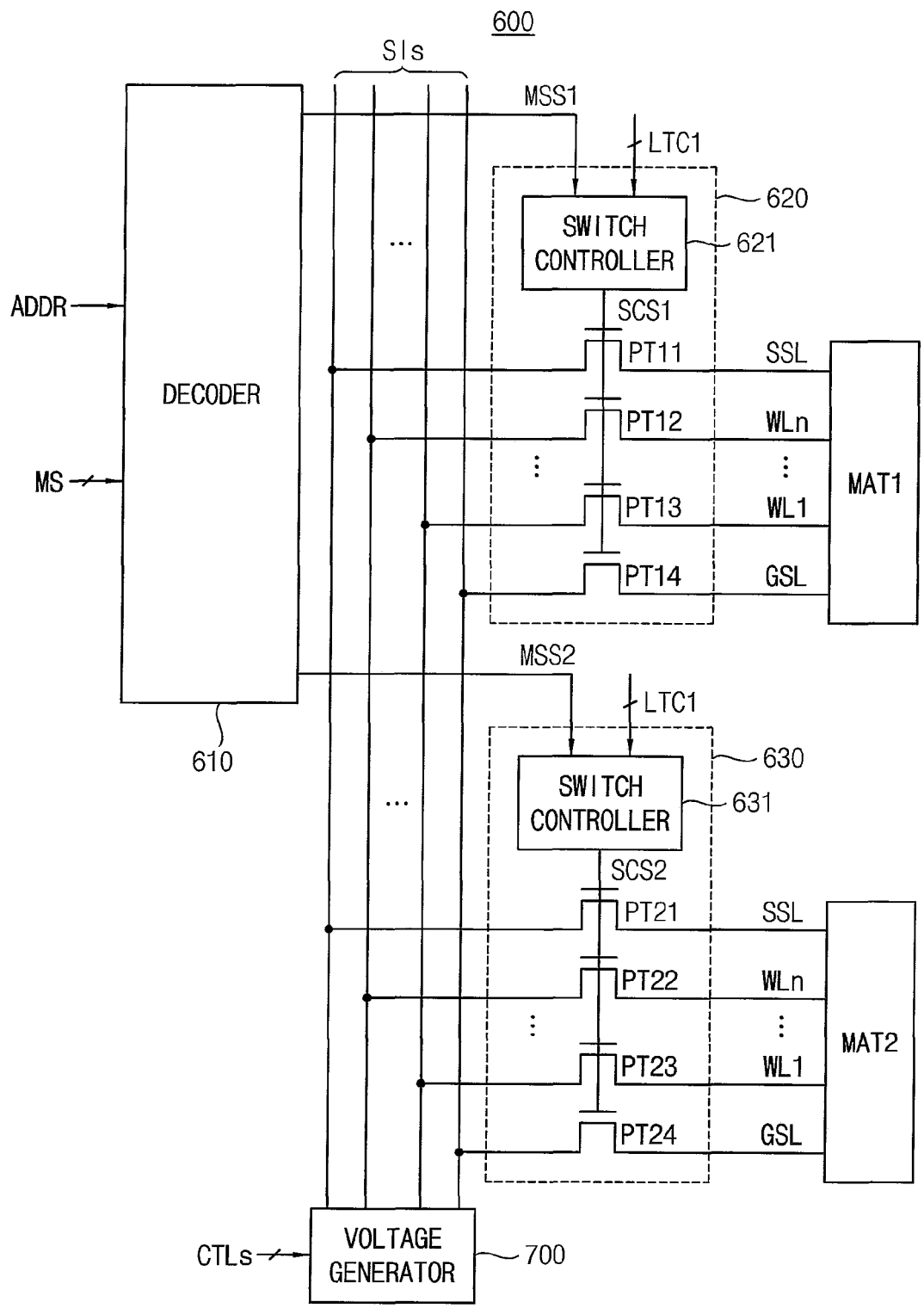
FIG. 9 is a block diagram illustrating a row decoder in the nonvolatile memory device of FIG. 3 according to exemplary embodiments.

FIG. 9 is a block diagram illustrating the row decoder in the nonvolatile memory device of FIG. 3 according to exemplary embodiments.

In FIG. 9, the first mat MAT1and the second mat MAT2 of the memory cell array 100 and the voltage generator 700 are altogether illustrated.

Referring to FIG. 9, the row decoder 600 includes a decoder 610, a first switch circuit 620 and a second switch circuit 630.

The decoder 610 receives the address ADDR and the mode signal MS, and generates a first mat selection signal MSS1 to select the first mat MAT1 and a second mat selection signal MSS2 to select the second mat MAT2 based on at least one mat designated by the address ADDR and the mode designated by the mode signal MS. When the mode signal MS indicates the single mat mode, the decoder 610 enables one of the first mat selection signal MSS1 and the second mat selection signal MSS2. When the mode signal MS indicates the multi-mat mode, the decoder 610 enables both the first mat selection signal MSS1 and the second mat selection signal MSS2. The decoder 610 provides the first mat selection signal MSS1 and the second mat selection signal MSS2 to the first mat MAT1 and the second mat MAT2 respectively.

The first switch circuit 620 and the second switch circuit 630 may be coupled to a plurality of selection lines Sls coupled to the voltage generator 700. The first switch circuit 620 is coupled to the first mat MAT1 through at least one string selection line SSL, a plurality of word-lines WL1~WLn and at least one ground selection line GSL. The second switch circuit 630 is coupled to the second mat MAT2 through at least one string selection line SSL, a plurality of word-lines WL1~WLn and at least one ground selection line GSL.

The first switch circuit 620 includes a switch controller 621 and a plurality of pass transistors PT11~PT14 coupled to the string selection line SSL, the word-lines WL1~WLn and the ground selection line GSL of the first mat MAT1. The switch controller 621 may control turn-on and turn-off of the pass transistors PT11~PT14 and turn-on timing of the pass transistors PT11~PT14 in response to the first mat selection signal MSS1 and the first control signal LTC1. For example, the switch controller 621 may control turn-on timing (e.g., a time interval) of the pass transistors PT11~PT14 by selecting a particular time interval from among a plurality of different time intervals in response to the first mat selection signal MSS1 and the first control signal LTC1.

The second switch circuit 630 includes a switch controller 631 and a plurality of pass transistors PT21~PT24 coupled to the string selection line SSL, the word-lines WL1~WLn and the ground selection line GSL of the second mat MAT2. The switch controller 631 may control turn-on and turn-off of the pass transistors PT21~PT24 and turn-on timing of the pass transistors PT21~PT24 in response to the second mat selection signal MSS2 and the first control signal LTC1. For example, the switch controller 631 may control turn-on timing (e.g., a time interval) of the pass transistors PT21~PT24 by selecting a particular time interval from among a plurality of different time intervals in response to the second mat selection signal MSS2 and the first control signal LTC1.

When the mode signal MS indicates the single mat mode and the address ADDR designates the first mat MAT1, the first mat selection signal MSS1 is enabled and the second mat selection signal MSS2 is disabled. The switch controller 621 enables a first switching control signal SCS1 during a first time interval (or, a first period of time) to turn-on the pass transistors PT11~PT14 during the first time in response to the first control signal LCT1. Therefore, the word-line voltages VWLs having first levels are applied to the first mat MAT1.

When the mode signal MS indicates a first sub mode of the multi-mat mode, the first and second mat selection signals MSS1 and MSS2 are enabled. The switch controller 621 enables a first switching control signal SCS1 during a first time interval to turn-on the pass transistors PT11~PT14 during the first time interval in response to the first control signal LCT1 and the switch controller 631 enables a second switching control signal SCS2 during the first time interval to turn-on the pass transistors PT21~PT24 during the first time interval in response to the first control signal LCT1. In example embodiments, voltage generator 700 may generate the word-line voltages VWLs in response to the control signals CTLs. In other example embodiments, the voltage generator 700 may generate the word-line voltages VWLs in response to the control signals CTLs and the first control signal LTC1. In this case, the voltage generator 700 may generate the word-line voltages VWLs by selecting one of different voltages in response to the control signals CTLs and the first control signal LTC1. For example, the word-line voltages VWLs having second levels greater than the first levels are applied to the first mat MAT1 and the second mat MAT2.

When the mode signal MS indicates a second sub mode of the multi-mat mode, the first and second mat selection signals MSS1 and MSS2 are enabled. The switch controller 621 enables a first switching control signal SCS1 during a second time interval longer than the first time interval to turn-on the pass transistors PT11~PT14 during the second time interval in response to the first control signal LCT1 and the switch controller 631 enables a second switching control signal SCS2 during the second time interval to turn-on the pass transistors PT21~PT24 during the second time interval in response to the first control signal LCT1. For example, the word-line voltages VWLs having the first levels are applied to the first mat MAT1 and the second mat MAT2.

In example embodiments, each of the first mat MAT1 and the second mat MAT2 may have an associated row decoder for applying word-line voltages to the word-lines. Thus, each of the first mat MAT1 and the second mat MAT2 can be operated separately from each other or simultaneously together based on the mode signal MS, the control signals CTLs, the first control signal LTC1, and the second control signal LTC2.

The word-line voltages VWLs may be transferred to the plurality of word-lines WLs and at least one of the string selection line SSL through the plurality of signal lines Sls.

Figure 10:
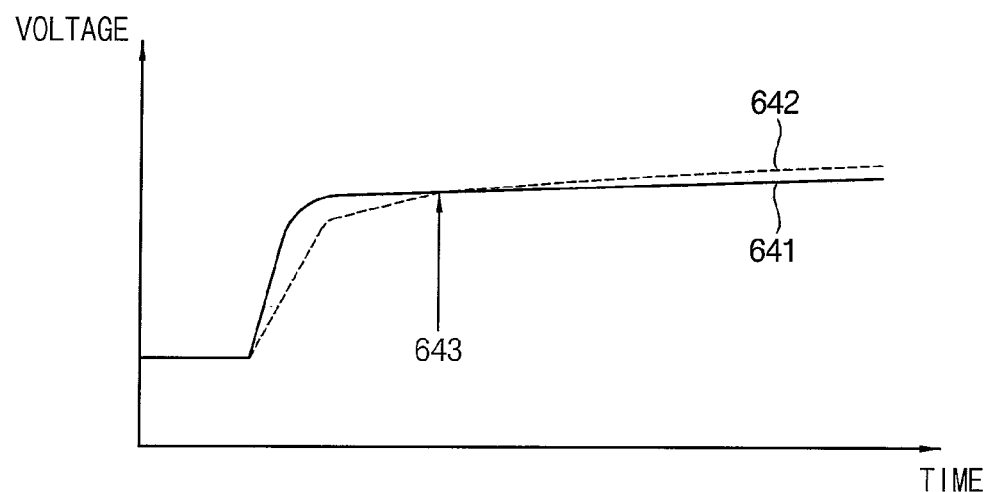
FIGS. 10 and 11 illustrate the word-line voltages or the bit-line voltages in the single mat mode and the multi-mat mode respectively, according to exemplary embodiments.
Figure 11:
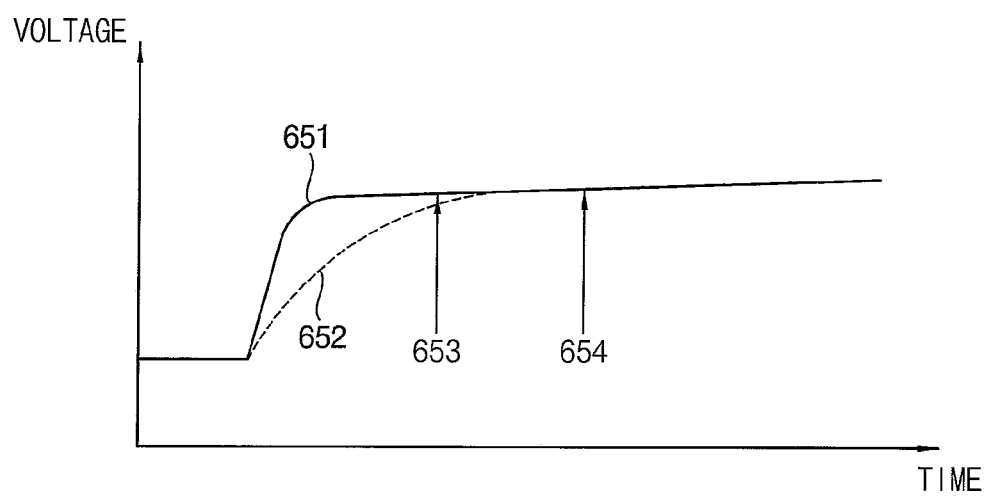

FIGS. 10 and 11 illustrate the word-line voltages or the bit-line voltages in the single mat mode and the multi-mat mode respectively, according to exemplary embodiments.

In FIG. 10, a reference numeral 641 represents one of the word-line voltages or one of the bit-line voltages in the single mat mode and a reference numeral 642 represents one of the word-line voltages or one of the bit-line voltages in the multi-mat mode. The level of the word-line voltage or the bit-line voltage in the multi-mat mode is higher than the level of the word-line voltage or the bit-line voltage in the single mat mode after a reference numeral 643. The reference numeral 643 may indicate that sensing timing is same for the single mat mode and the multi-mat mode.

Although not illustrated, the level of the word-line voltage or the bit-line voltage in the multi-mat mode may be lower than the level of the word-line voltage or the bit-line voltage in the single mat mode.

In FIG. 11, a reference numeral 651 represents one of the word-line voltages or one of the bit-line voltages in the single mat mode and a reference numeral 652 represents one of the word-line voltages or one of the bit-line voltages in the multi-mat mode. Application time interval of the word-line voltage or the bit-line voltage in the multi-mat mode may be longer than the application time interval of the word-line voltage or the bit-line voltage in the single mat mode. In this case, the applied voltage (word-line voltage or bit-line voltage) is the same in the single mat mode and the multi-mat mode. A reference numeral 653 may indicate that sensing time for the single mat mode and a reference numeral 654 for the multi-mat mode. The reference numerals 653 and 654 indicate that sensing timings are different for the single mat mode and the multi-mat mode. Although not illustrated, the application time interval of the word-line voltage or the bit-line voltage in the multi-mat mode may be shorter than the application time interval of the word-line voltage or the bit-line voltage in the single mat mode.

Although a voltage level of the word-line voltage may be different from a voltage level of the bit-line voltage, a difference between the voltage levels of the word-line voltage and the bit-line voltage is not shown in FIGS. 10 and 11 for convenience in explanation.

Figure 12:
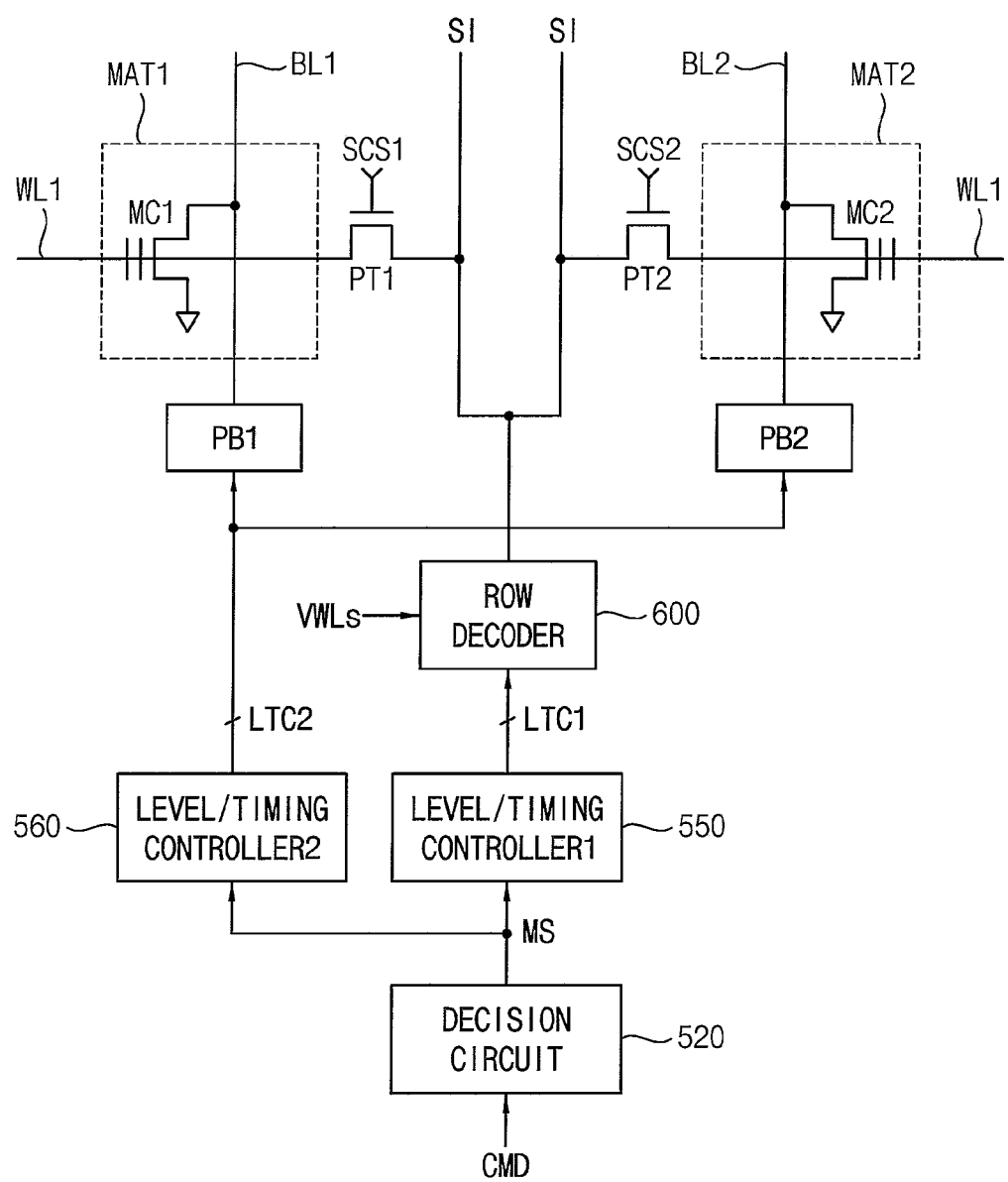
FIG. 12 illustrates the nonvolatile memory device of FIG. 3 according to exemplary embodiments.

FIG. 12 illustrates the nonvolatile memory device of FIG. 3 according to exemplary embodiments.

In FIG. 12, the first mat MAT1 of the memory cell array 100 includes a first memory cell MC1 coupled to a word-line WL1 and a bit-line BL1 and the second mat MAT2 of the memory cell array 100 includes a second memory cell MC2 coupled to the word-line WL1 and a bit-line BL2. The first memory cell MC1 is coupled to a selection line Sl through a pass transistor PT1 receiving the first switching control signal SCSI and the second memory cell MC2 is coupled to the selection line S1 through a pass transistor PT2 receiving the second switching control signal SCS2.

The bit-line BL1 is coupled to a page buffer PB1, the bit-line BL2 is coupled to a page buffer PB2 and the second level/timing controller 560 generates the second control signal LTC2 and controls the page buffers PB1 and PB2 in response to the second control signal LTC2.

In example embodiments, a bit-line voltage generator (not shown) may generate variable bit-line voltages in response to the second control signal LTC2. For example, the bit-line voltage generator (not shown) may generate a selected bit-line voltage by selecting one of different voltages in response to the second control signal LTC2. The bit-line voltage generator (not shown) may be connected to the page buffers PB1 and PB2 and may apply the bit-line voltages to the page buffers PB1 and PB2. The page buffers PB1 and PB2 may apply bit-line voltages to the bit-lines BL1 and BL2.

In example embodiments, the bit-line voltage generator (not shown) may be included in each of the page buffers PB1 and PB2, or disposed separately from the page buffers PB1 and PB2.

In example embodiments, each of the page buffers PB1 and PB2 may apply a bit-line voltage to the selected bit-line during a selected time interval from among a plurality of different time intervals in response to the mode signal MS and the second control signal LTC2

In example embodiments, each of the first mat MAT1 and the second mat MAT2 may have an associated page buffer for applying bit-line voltages to the bit-lines. Thus, each of the first mat MAT1 and the second mat MAT2 can be operated separately from each other or simultaneously together based on the mode signal MS and the second control signal LTC2.

Figure 13:
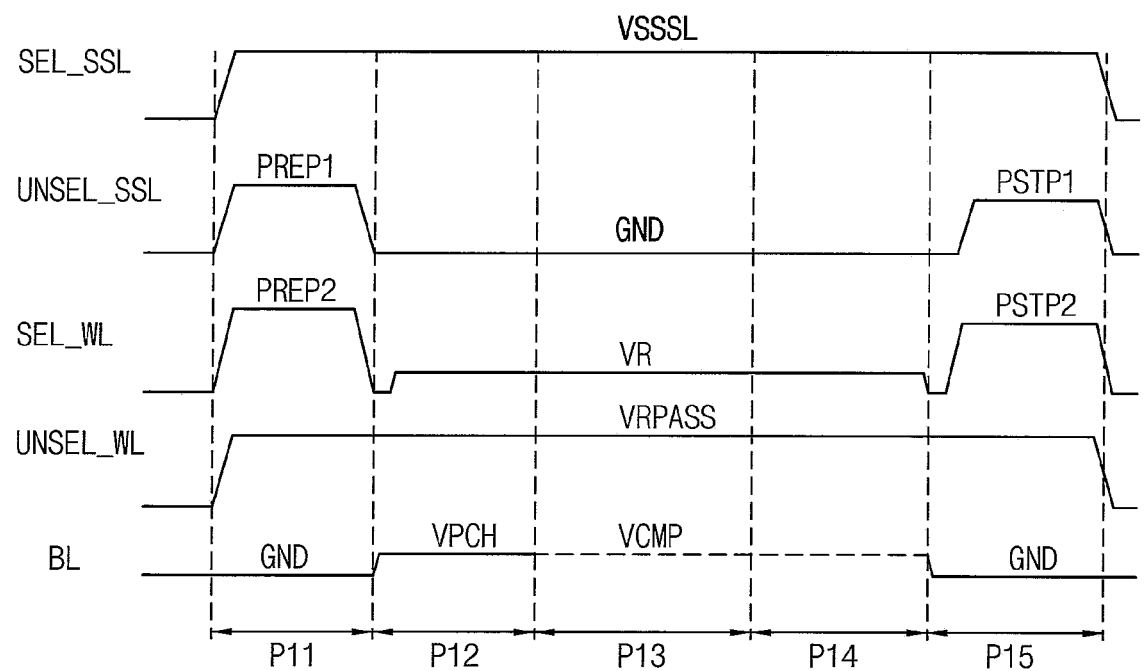
FIG. 13 is a timing diagram illustrating the word-line voltages and the bit-line voltages applied to the first and second mats in the single mat mode and the multi-mat mode in FIG. 6 when a read operation is performed on the nonvolatile memory device of FIG. 3, according to exemplary embodiments.

FIG. 13 is a timing diagram illustrating the word-line voltages and the bit-line voltages applied to the first and second mats in the single mat mode and the multi-mat mode in FIG. 6 when a read operation is performed on the nonvolatile memory device of FIG. 3, according to exemplary embodiments.

Referring to FIGS. 3 through 13, when the read operation is performed on the nonvolatile memory device 30, a selection voltage VSSSL is applied to a selected string selection line SEL_SSL during first through fifth intervals P11~P15, a first pre-pulse PREP1 is applied to an unselected string selection line UNSEL_SSL during the first interval P11, the unselected string selection line UNSEL_SSL is discharged with a ground voltage during the second through fourth intervals P12~P14 and a first post-pulse PSTP1 is applied to the unselected string selection line UNSEL_SSL during the fifth interval P15.

In addition, a second pre-pulse PREP2 is applied to a selected word-line SEL_WL during the first interval P11, the read voltage VR is applied to the selected word-line SEL_WL during the second through fourth intervals P12~P14 and a second post-pulse PSTP2 is applied to the selected word-line SEL_WL during the fifth interval P15. A read pass voltage VRPASS is applied to an unselected word-line UNSEL_WL during the first through fifth intervals P11~P15.

The bit-line BL is set-up during the first interval P11, is precharged by receiving a precharge voltage VPCH during the second interval P12, is developed during the third interval P13, is clamped with a voltage VCMP during the third and fourth intervals P13 and P14, and is discharged with the ground voltage during the fifth interval P15.

Figure 14:
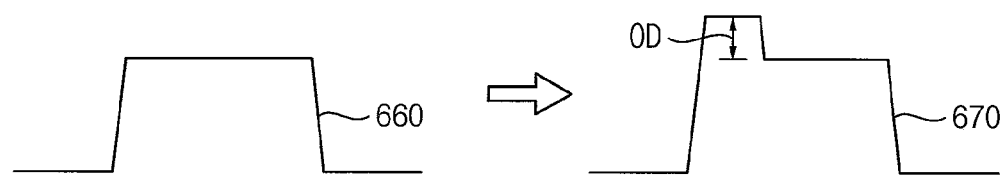
FIG. 14 illustrates that one of the word-line voltages or one of the bit-line voltages in the single mat mode is over-driven in the multi-mat mode, according to exemplary embodiments.

FIG. 14 illustrates that one of the word-line voltages or one of the bit-line voltages in the single mat mode is over-driven in the multi-mat mode, according to exemplary embodiments.

In FIG. 14, a reference numeral 660 represents one of the word-line voltages or one of the bit-line voltages in the single mat mode and a reference numeral 670 represents one of the word-line voltages or one of the bit-line voltages in the multi-mat mode. The voltage level is over-driven by an amount OD and then reduced to the voltage level of the single mat mode in the multi-mat mode. Over-driving the voltage levels may mean that the voltage levels are different in the single mat mode and the multi-mat mode and over-driving the voltage levels may be applicable to overall program operation in addition to the read operation.

FIG. 15 is a table illustrating setting values of levels and application time interval of the word-line voltages and the bit-line voltages applied to the first second mats in FIGS. 13 and 14 when a read operation is performed on the nonvolatile memory device of FIG. 3, according to exemplary embodiments.

Referring to FIG. 15, when the read operation is performed on the nonvolatile memory device 30, it is noted that the setting values of levels and application time interval of the word-line voltages and the bit-line voltages in the single mat mode are smaller than the setting values of levels and application time interval of the word-line voltages and the bit-line voltages in the multi-mat mode.

The setting values in FIG. 15 may be stored as the command set CMDSET in the first level/timing controller 550 and the second level/timing controller 560 in FIG. 7. In addition, the setting values in FIG. 15 may be stored based on information which is predetermined in the nonvolatile memory device 30. The first level/timing controller 550 and the second level/timing controller 560 may control the row decoder 600 and the page buffer circuit 410 respectively by referring the setting values such that at least one of the voltage levels and the application time interval are different in the single mat mode and the multi-mat mode.

For example, a level of the second pre-pulse PREP2 applied to a selected word-line SEL_WL may be 5.3V in the single mat mode and may be 5.5V in the multi-mat mode, during a specific period of time (e.g., the first interval P11). As another example, the second pre-pulse PREP2 having a particular voltage (e.g., 5.3V) may be applied during Bus in the single mat mode and may be applied during 8.2 us in the multi-mat mode.

Although not illustrated, in exemplary embodiments, that the setting values of levels and application time interval of the word-line voltages and the bit-line voltages in the single mat mode are greater than the setting values of levels and application time interval of the word-line voltages and the bit-line voltages in the multi-mat mode.

Figure 16:
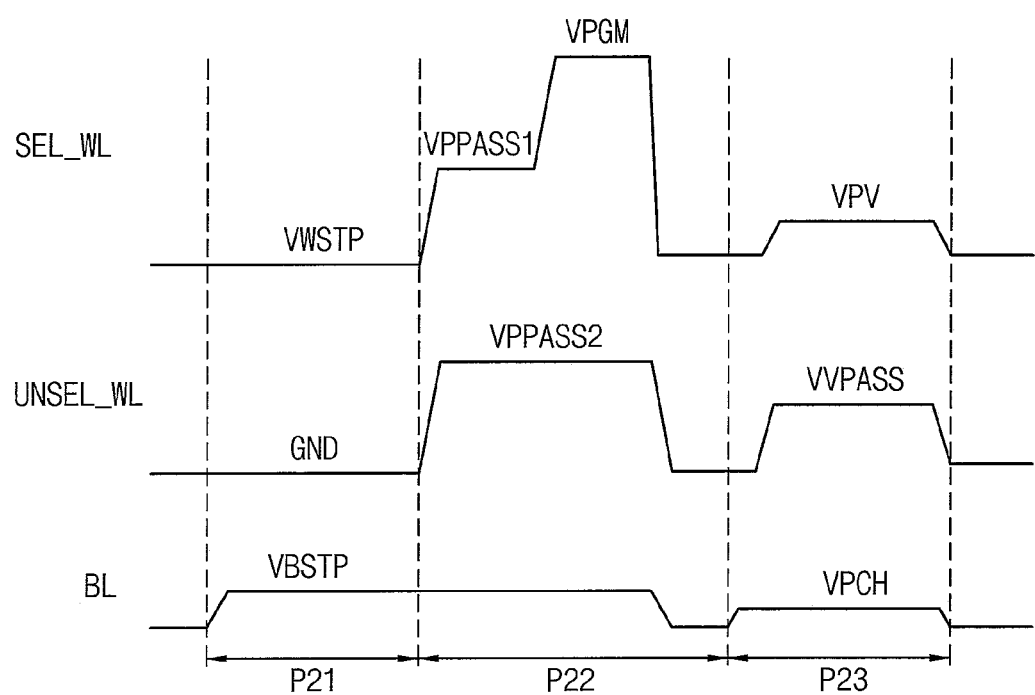
FIG. 16 is a timing diagram illustrating the word-line voltages and the bit-line voltages applied to the first and second mats in the single mat mode and the multi-mat mode in FIG. 6 when a program operation is performed on the nonvolatile memory device of FIG. 3, according to exemplary embodiments.

FIG. 16 is a timing diagram illustrating the word-line voltages and the bit-line voltages applied to the first and second mats in the single mat mode and the multi-mat mode in FIG. 6 when a program operation is performed on the nonvolatile memory device of FIG. 3, according to exemplary embodiments.

Referring to FIGS. 3 through 12 and 16, when the program operation is performed on the nonvolatile memory device 30, a word-line set-up voltage VWSTP is applied to a selected word-line SEL_WL during a first interval P21, a program pass voltage VPPASS1 and a program voltage VPGM are sequentially applied to the selected word-line SEL_WL during a second interval P22 and a program verification voltage VPV is applied to the selected word-line SEL_WL during a third interval P23 to verify whether the program operation is properly performed.

A ground voltage GND is applied to an unselected word-line UNSEL_WL during the first interval P21 to discharge the unselected word-line UNSEL_WL, a program pass voltage VPPASS2 is applied to the unselected word-line UNSEL_WL during the second interval P22 and a verification pass voltage VVPASS is applied to the unselected word-line UNSEL_WL during the second interval P23.

The bit-line BL is set-up by receiving the bit-line set-up voltage VBSTP during the first and intervals P21 and P22, is precharged by receiving a precharge voltage VPCH during the third interval P23, and is discharged after the third interval P23.

FIG. 17 is a table illustrating setting values of levels and application time interval of the word-line voltages and the bit-line voltages applied to the first and second mats in FIG. 16 when the program operation is performed on the nonvolatile memory device of FIG. 3, according to exemplary embodiments.

Referring to FIG. 17, when the program operation is performed on the nonvolatile memory device 30, it is noted that the setting values of levels and application time interval of the word-line voltages and the bit-line voltages in the single mat mode are smaller than the setting values of levels and application time interval of the word-line voltages and the bit-line voltages in the multi-mat mode.

The setting values in FIG. 17 may be stored as the command set CMDSET in the first level/timing controller 550 and the second level/timing controller 560 in FIG. 7. The first level/timing controller 550 and the second level/timing controller 560 may control the row decoder 600 and the page buffer circuit 410 respectively by referring the setting values such that at least one of the voltage levels and the application time interval are different in the single mat mode and the multi-mat mode.

FIG. 15 illustrates the setting values of levels and application time interval of the word-line voltages and the bit-line voltages in the single mat mode and the multi-mat mode during the read operation on the nonvolatile memory device 30 and FIG. 17 illustrates the setting values of levels and application time interval of the word-line voltages and the bit-line voltages in the single mat mode and the multi-mat mode during the program operation on the nonvolatile memory device 30.

Although not illustrated, levels and application time interval of the erase voltage applied to the well of the memory block in the erase operation and levels and application time interval of the erase verification voltage in the erase verification operation may be different in the single mat mode and the multi-mat mode. Setting values of the erase voltage and the erase verification voltage may be stored as the command set CMDSET in the first level/timing controller 550 and the second level/timing controller 560.

The operation on the nonvolatile memory device 30 may include one of the program operation, the read operation and the erase operation.

Figure 18:
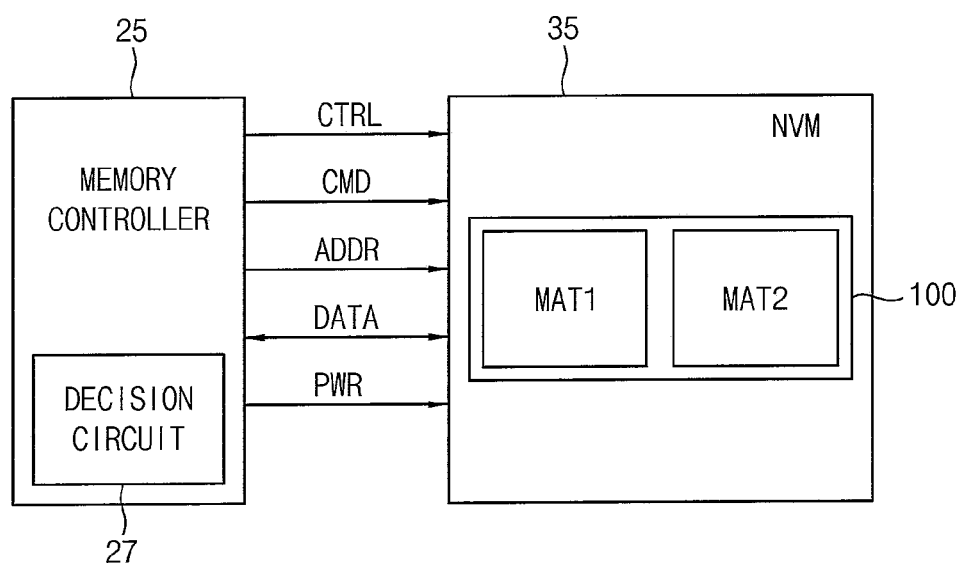
FIG. 18 is a block diagram illustrating a memory system according to exemplary embodiments.

FIG. 18 is a block diagram illustrating a memory system according to exemplary embodiments.

Referring to FIG. 18, a memory system (or, a nonvolatile memory system) 15 may include a memory controller 25 and at least one nonvolatile memory device 35.

The memory system 15 of FIG. 18 differs from the memory system of FIG. 1. The nonvolatile memory device 30 includes the decision circuit 520 in FIG. 1 while the memory controller 25 includes a decision circuit 27.

When the memory controller 25 includes the decision circuit 27, a control circuit such as the control circuit 500 of FIG. 7, which may be included in the nonvolatile memory device 35, may include components of the control circuit 500 except the decision circuit 520.

The decision circuit 27 determines a number of mats of the mats MAT1 and MAT2, which operate simultaneously, and transmits the command CMD or the control signal CTRL including a mode signal indicating the number of mats which operate simultaneously to the nonvolatile memory device 35.

For example, when the decision circuit 27 determines a single mat mode or a multi-mat mode of the mats MAT1 and MAT2, the decision circuit 27 may transmit, to the nonvolatile memory device 35, levels and an application time interval of the word-line voltages or levels and an application time interval of the bit-line voltages applied to the bit-lines as a command set before the decision circuit transmit 25, to the nonvolatile memory device 35, a command sequence designating one of the single mat mode and the multi-mat mode.

For example, when the decision circuit 27 determines the single mat mode or the multi-mat mode of the mats MAT1 and MAT2, the decision circuit 27 may transmit, to the nonvolatile memory device 35, the levels and an application time interval of the word-line voltages or the levels and an application time interval of voltages of the bit-lines as a command set with the mode signal designating one of the single mat mode and the multi-mat mode. The command set of the setting values may be included in the command sequence transmitted to the nonvolatile memory device 35.

Figure 19:
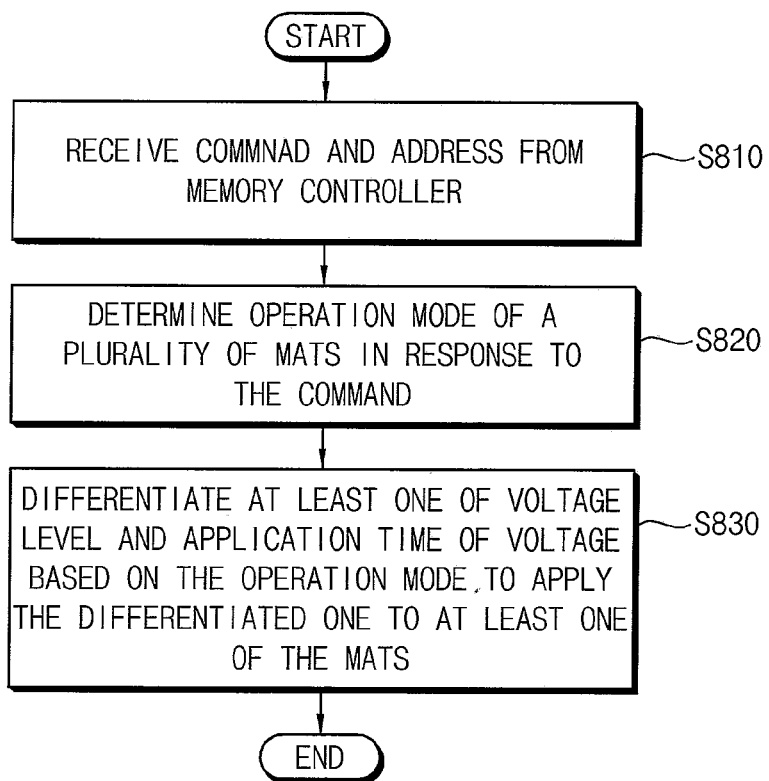
FIG. 19 is a flow chart illustrating a method of nonvolatile memory device according to exemplary embodiments.

FIG. 19 is a flow chart illustrating a method of nonvolatile memory device according to exemplary embodiments.

Referring to FIG. 1 through 19, in a method of operating a nonvolatile memory device 30 including a memory cell array including a plurality of mats corresponding to different bit-lines, the nonvolatile memory device 30 receives a command CMD and an address ADDR from a memory controller 20 (S810).

A decision circuit 520 of a control circuit 500 determines an operation mode to one of a single mat mode and a multi-mat mode in response to the command CMD (S820).

The decision circuit 520 provides first and second level/timing controllers 550 and 560 with a mode signal MS designating one of the single mat mode and the multi-mat mode to control the row decoder 600 and the page buffer circuit 410 such that at least one of levels of the word-line voltages or the bit-line voltages and an application time interval of the word-line voltages or the bit-line voltages are different in the single mat mode and the multi-mat mode (S830).

In a nonvolatile memory device, a memory system and a method of a nonvolatile memory device according to exemplary embodiments, levels or application time intervals of the voltages applied to the memory cell array are differentiated in the single mat mode and the multi-mat mode, and performance in both the single mat mode and the multi-mat mode may be enhanced.

Figure 20:
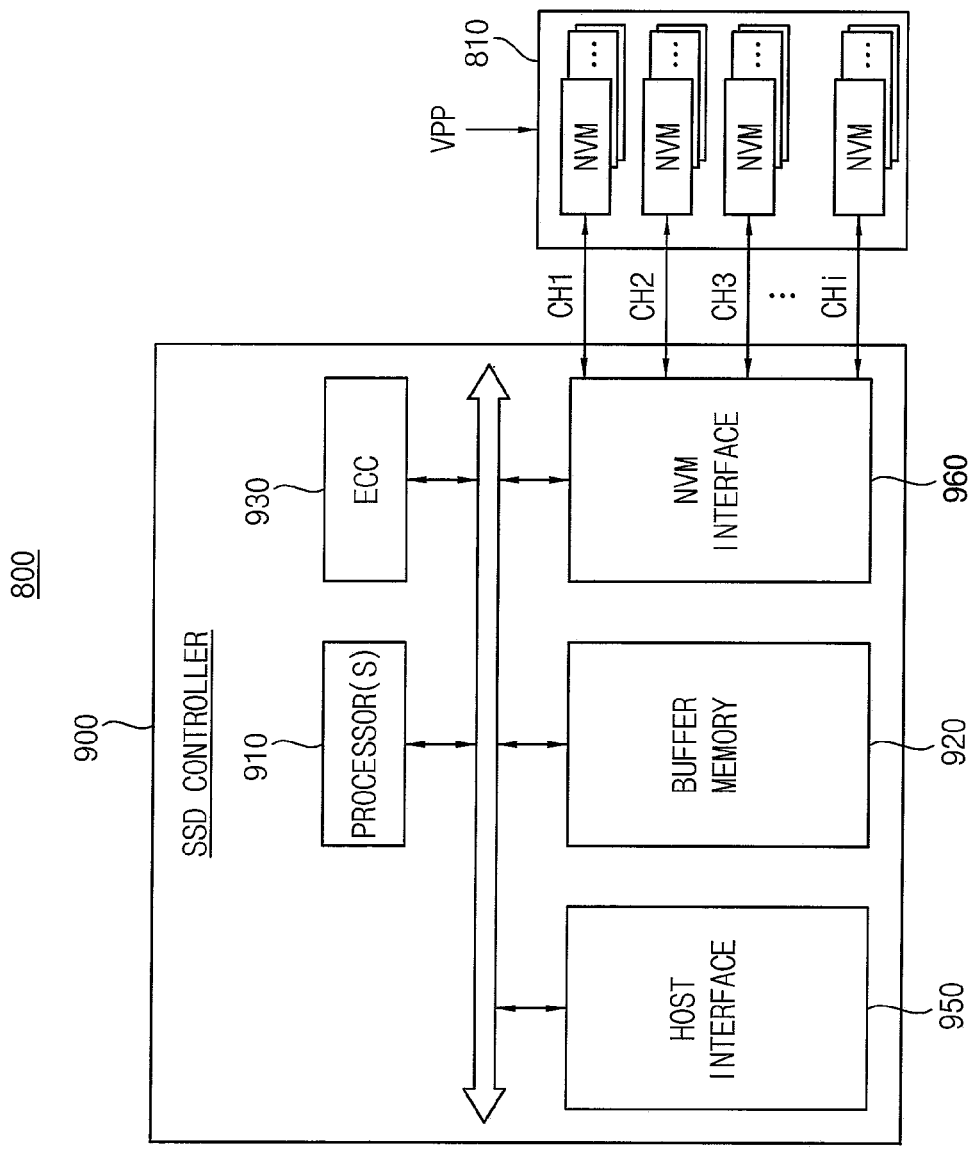
FIG. 20 is a block diagram illustrating a solid state disk or solid state drive (SSD) according to exemplary embodiments.

FIG. 20 is a block diagram illustrating a solid state disk or solid state drive (SSD) according to exemplary embodiments.

Referring to FIG. 20, an SSD 800 includes multiple nonvolatile memory devices 810 and an SSD controller 900.

The nonvolatile memory devices 810 may be optionally supplied with an external high voltage VPP. Each of the nonvolatile memory devices 810 may employ the nonvolatile memory device 30 of FIG. 3. Each of the nonvolatile memory devices 810 may differentiate levels or application time intervals of the voltages applied to the word-lines and bit-lines of the memory cell array in the single mat mode and in the multi-mat mode The SSD controller 900 is connected to the nonvolatile memory devices 810 through multiple channels CH1 to CHi. The SSD controller 900 includes one or more processors 910, a buffer memory 920, an ECC block 930, a host interface 950, and a nonvolatile memory interface 960. The buffer memory 920 stores data used to drive the SSD controller 900.

The buffer memory 920 includes multiple memory lines each storing data or a command.

The ECC block 930 calculates error correction code values of data to be programmed at a writing operation and corrects an error of read data using an error correction code value at a read operation.

Figure 21:
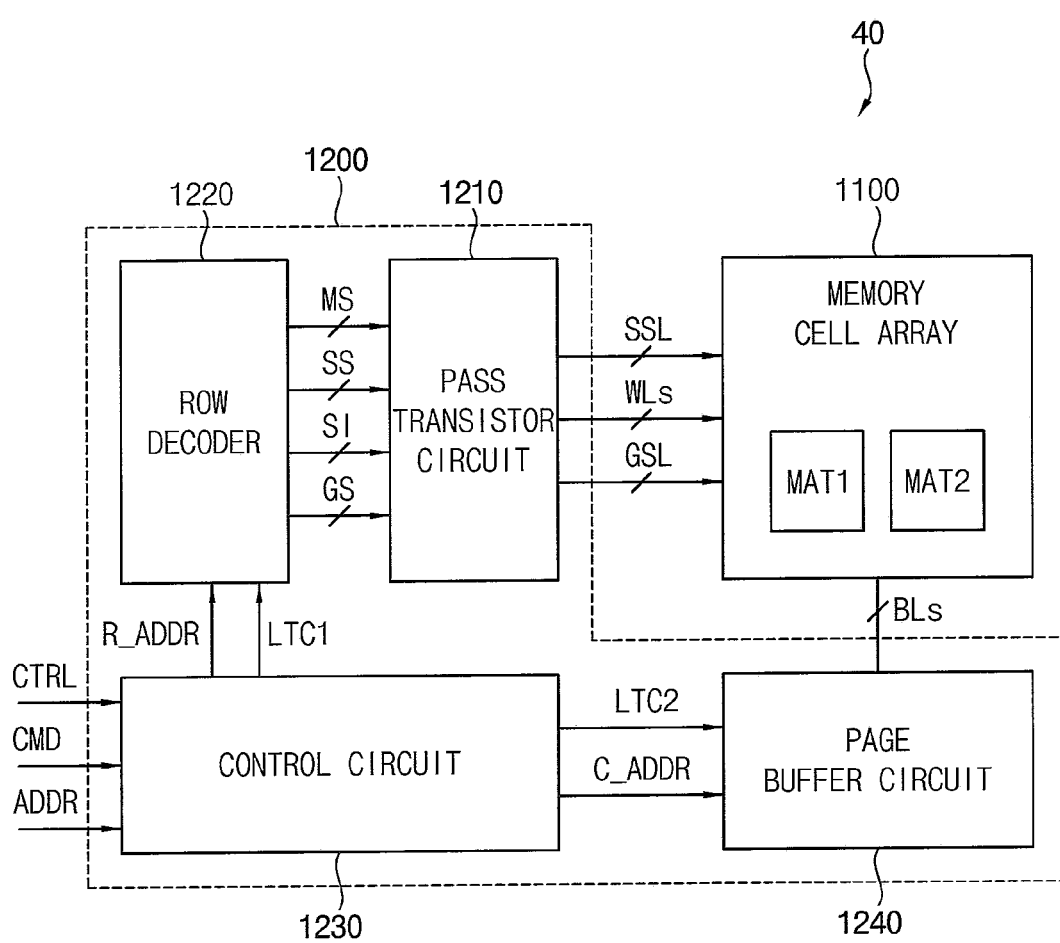
FIG. 21 is a block diagram of a memory device according to some embodiments.

FIG. 21 is a block diagram of a memory device according to some embodiments.

Referring to FIG. 21, a memory device 40 may include a memory cell array 1100 and a peripheral circuit 1200. The peripheral circuit 1200 may include a pass transistor circuit 1210, a row decoder 1220, a control circuit 1230, and a page buffer circuit 1240. Although not shown the peripheral circuit 1200 may further include a data I/O circuit, a voltage generator, an I/O interface, column logic, a pre-decoder, a temperature sensor, a command decoder, and/or an address decoder. In some embodiments, the memory device 40 may be a nonvolatile memory device. Hereinafter, the term "memory device" refers to a nonvolatile memory device. The memory cell array 1100 may include a first mat MAT1 and a second mat MAT2. The memory cell array 1100 may include the memory cell array 100b of FIG. 6.

Figure 22:
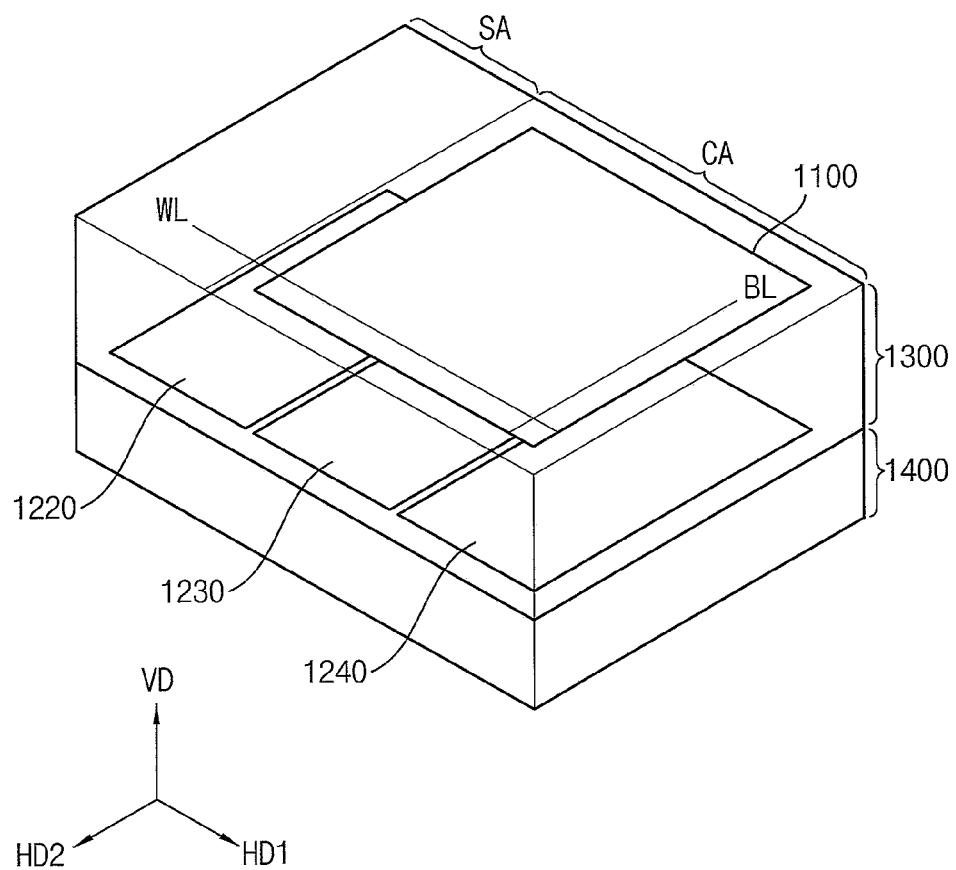
FIG. 22 is a diagram schematically illustrating the structure of the memory device of FIG. 21 according to some example embodiments.

In some example embodiments, the memory cell array 1100 and at least a portion of the pass transistor circuit 1210 may be in an upper or first semiconductor layer (e.g., 1300 in FIG. 22), and the row decoder 1220, the control circuit 1230, and the page buffer circuit 1240 may be located in a lower or second semiconductor layer (e.g., 1400 in FIG. 22). However, the invention is not limited to these embodiments described above. In some embodiments, at least some of the circuits forming the row decoder 1220 may be in an upper semiconductor layer together with the memory cell array 1100 and the pass transistor circuit 1210, and the others of the circuits forming the pass transistor circuit 1210, the control circuit 1230, and page buffer circuit 1240 may be in a lower semiconductor layer.

Figure 25:
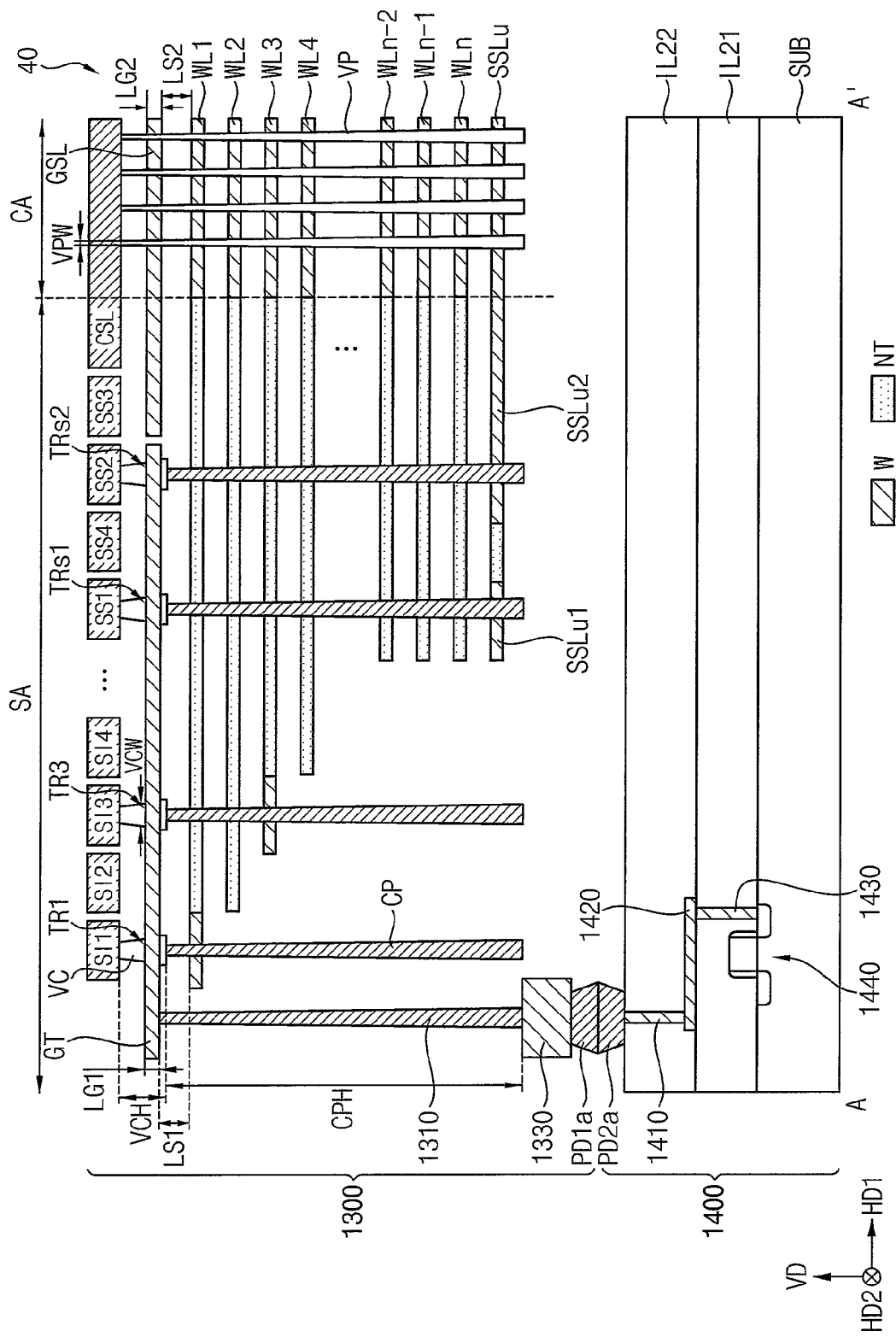
FIG. 25 is a cross-sectional view taken along a line A-A' of FIG. 24, according to some example embodiments.

In some example embodiments, the pass transistor circuit 1210 may include a plurality of vertical pass transistors (e.g., TR1, TR3, TRs1, and TRs2 in FIG. 25). For example, a plurality of vertical pass transistors may be on the upper semiconductor layer. In this specification, the term "vertical pass transistor" refers to a transistor including a vertical channel.

Figure 27A:
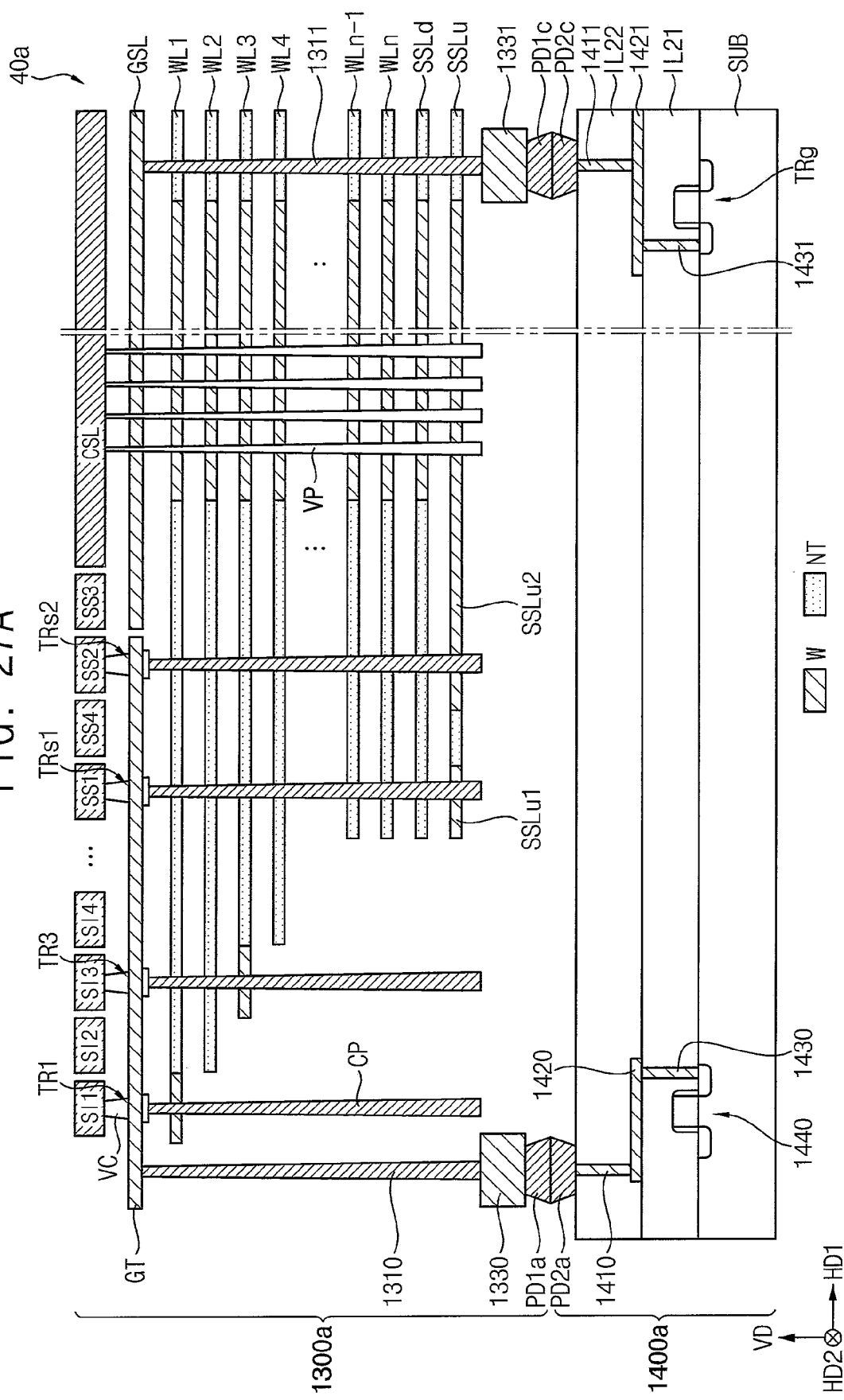
FIGS. 27A through 27C are diagrams of memory devices including the pass transistor circuit in FIG. 23 respectively, according to example embodiments.

In some example embodiments, the pass transistor circuit 1210 may include at least one normal pass transistor (e.g., TRg in FIG. 27A). In this specification, the term "normal pass transistor" refers to a transistor including a horizontal channel. For example, a plurality of vertical pass transistors may be on an upper semiconductor layer, and a plurality of normal pass transistors may be on a lower semiconductor layer. However, embodiments are not limited thereto, and at least one normal pass transistor may be on the upper semiconductor layer.

The memory cell array 1100 may be connected to the page buffer circuit 1240 through bit-lines BLs and to the pass transistor circuit 1210 through word-lines WLs, string selection lines SSL, and ground selection lines GSL. In addition, the pass transistor circuit 1210 may be connected to the row decoder 1220 through mat selection signal lines MSS, string selection line driving signal lines SS, word-line driving signal lines SI, and ground selection line driving signal lines GS. The string selection line driving signal lines SS, the word-line driving signal lines SI, and the ground selection line driving signal lines GS may be referred to as "driving signal lines".

The memory cell array 1100 may include the first mat MAT1 and the second mat MAT2, and each of the first mat MAT1 and the second mat MAT2 may include a plurality of memory cells. For example, the memory cells may include flash memory cells. Hereinafter, embodiments will be described using, as an example, the case that a plurality of memory cells are NAND flash memory cells. However, embodiments are not limited thereto. In some example embodiments, the plurality of memory cells may be resistive memory cells such as resistive random access memory (ReRAM) cells, phase-change RAM (PRAM) cells, or magnetic RAM (MRAM) cells.

In some example embodiments, the memory cell array 1100 may include a three-dimensional (3D) memory cell array. The 3D memory cell array may include a plurality of NAND strings, of which each may include memory cells respectively connected to word-lines vertically stacked on a substrate. This was described in detail with reference to FIGS. 4 and 5. However, embodiments are not limited thereto. In some example embodiments, the memory cell array 100 may include a two-dimensional (2D) memory cell array that may include a plurality of NAND strings in rows and columns.

The control circuit 1230 may generate various control signals for programming data to the memory cell array 1100, reading data from the memory cell array 1100, or erasing data from the memory cell array 1100 based on a command CMD, an address ADDR, and a control signal CTRL. For example, the control circuit 1230 may output a row address R_ADDR that is sent to the row decoder 1220 and/or a column address C_ADDR that is sent to the page buffer circuit 1240. In addition, the control circuit 1230 may generate a first control signal LTC1 for controlling the row decoder 1220 and may generate a second control signal LTC2 for controlling the page buffer circuit 1240. Accordingly, the control circuit 1230 may generally control various operations of the memory device 40.

The control circuit 1230 may employ the control circuit 500 of FIG. 7.

The row decoder 1220 may output a mat selection signal for selecting one of a plurality of memory blocks of one or both of the first and second mats MAT1 and MAT2 to the mat selection signal lines MSS in response to the row address R_ADDR. In response to the row address R_ADDR, the row decoder 1220 may also output a word-line driving signal for selecting one of the word-lines WL of the selected mat to the word-line driving signal lines SI, a string selection line driving signal for selecting one of the string selection lines SSL to the string selection line driving signal lines SS, and a ground selection line driving signal for selecting one of the ground selection lines GSL to the ground selection line driving signal lines GS. The page buffer circuit 1240 may select some of the bit-lines BL in response to the column address C_ADDR and the second control signal LTC2. The page buffer circuit 1240 may operate as a write driver or a sense amplifier according to an operating mode. The page buffer circuit 1240 may be connected to the data I/O circuit (not shown) and the data I/O circuit may receive or transmit data from or to outside the memory device 40.

As the level of memory cells arranged in the memory cell array 1100 (i.e., the number of word-lines WLs stacked in the vertical direction) increases with the development of semiconductor processes, the number of pass transistors driving the word-lines WLs increases, and accordingly, the area of the pass transistor circuit 1210 may increase. At least a portion of the pass transistor circuit 1210 of the memory device 40 may be in a stair area (e.g., stair area SA in FIG. 22) of the word-lines WLs. In some example embodiments, the pass transistor circuit 1210 may include a plurality of vertical pass transistors in the stair area of the word-lines WLs. Accordingly, the area of the pass transistor circuit 1210 overlaps the stair area of the word-lines WLs, and therefore, an increase in a chip size of the memory device 40 may be prevented even when the number of pass transistors increases with the increase in the number of stacked layers of the word-lines WLs. For example, the overall chip size is reduced by using the overlapping stair area SA.

FIG. 22 is a diagram schematically illustrating the structure of the memory device of FIG. 21 according to some example embodiments.

Referring to FIGS. 21 and 22, the memory device 40 may include a first semiconductor layer 1300 and a second semiconductor layer 1400. The first semiconductor layer 1300 may be stacked on the top of the second semiconductor layer 1400 in a vertical direction VD. For example, the second semiconductor layer 1400 may be on the bottom of the first semiconductor layer 1300 in the vertical direction VD.

In some example embodiments, the memory cell array 1100 and at least some pass transistors of the pass transistor circuit 1210 may be formed in the first semiconductor layer 1300, and the row decoder 1220, the control circuit 1230, and the page buffer circuit 1240 may be formed in the second semiconductor layer 1400. However, embodiments are not limited thereto, and at least a portion of the circuit of the row decoder 1220 may be in the first semiconductor layer 1300. Accordingly, the memory device 40 may have a cell over periphery (COP) structure, in which the memory cell array 1100 is above a portion of the periphery circuit 1200 that includes the row decoder 1220, the control circuit 1230 and/or the page buffer circuit 1240. The COP structure may effectively reduce a horizontal area and may increase the integration density of the memory device 40.

In some example embodiments, the first semiconductor layer 1300 and the second semiconductor layer 1400 may be formed in different wafers, respectively, and may be combined with each other using Cu-to-Cu (C2C) wafer bonding, thereby manufacturing the memory device 40. For example, a plurality of bonding pads may be formed on a first surface of the first semiconductor layer 1300, and a plurality of bonding pads may be formed on a first surface of the second semiconductor layer 1400. The bonding pads of the first semiconductor layer 1300 may be connected to the bonding pads of the second semiconductor layer 1400. However, the memory device 40 is not limited thereto, and the first semiconductor layer 1300 and the second semiconductor layer 1400 may be formed in one wafer.

In the first semiconductor layer 1300, the word-lines WL may extend in a first horizontal direction HD1 and the bit-lines BL may extend in a second horizontal direction HD2. The first and second horizontal directions HD1 and HD2 may be perpendicular to one another. Respective ends of the word-lines WL may form a stair shape. In this specification, an area that includes the word-lines WL in a stair shape in the first semiconductor layer 1300 will be referred to as a "stair area SA".

In the first semiconductor layer 1300, a vertical channel structure may be formed, thereby forming a cell area CA in which memory cells are formed. Accordingly, the memory cell array 1100 may be located in the cell area CA.

Figure 23:
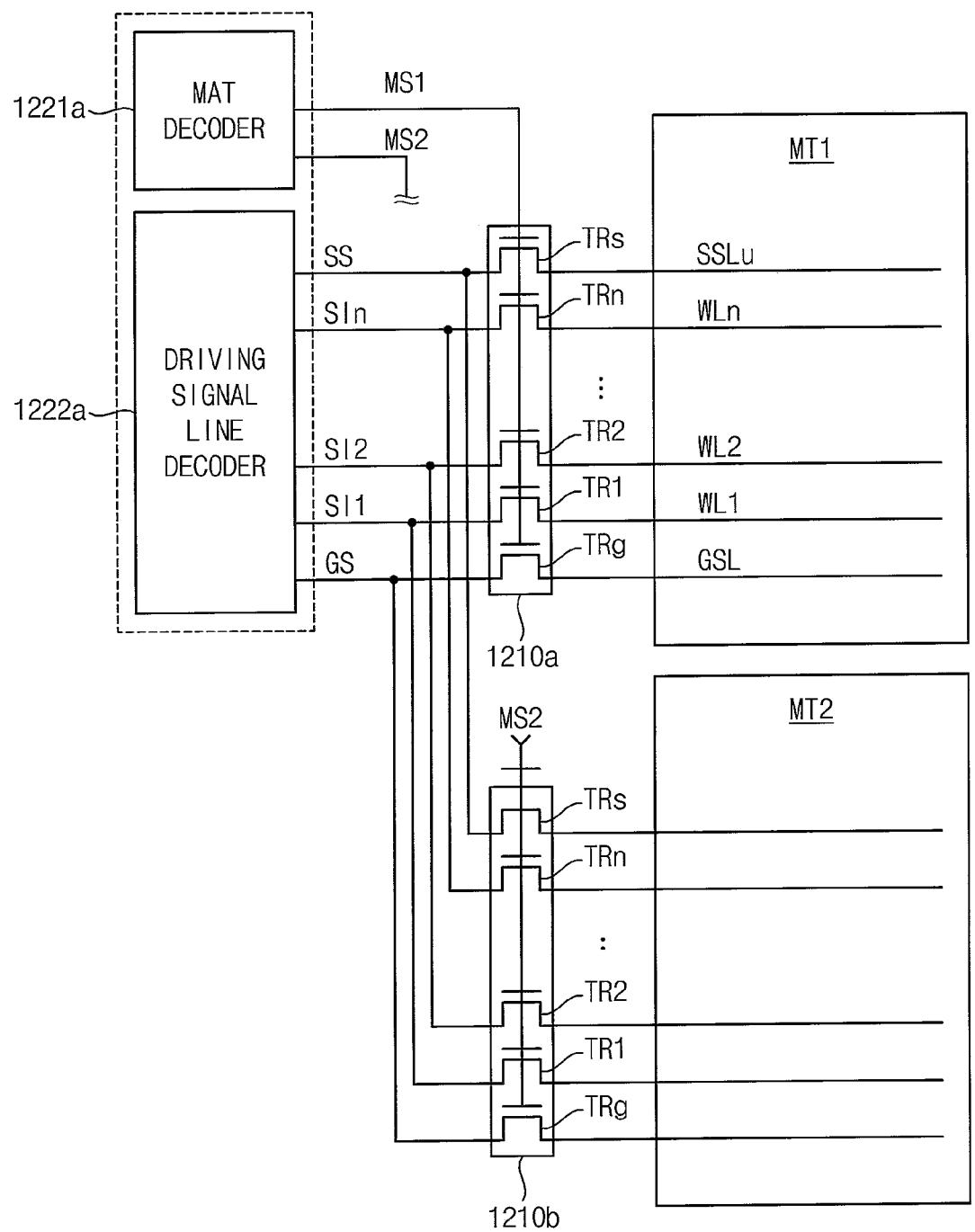
FIG. 23 is a diagram illustrating a row decoder and a pass transistor circuit in the memory device of FIG. 21 according to an example embodiment.

FIG. 23 is a diagram illustrating a row decoder and a pass transistor circuit in the memory device of FIG. 21 according to an example embodiment.

Referring to FIG. 23, the first mat MAT1 and the second mat MAT2 are illustrated. The row decoder 1220a may be an example of the row decoder 1220 in FIG. 21, and a pass transistor circuit 1210a and a pass transistor circuit 1210b may be an example of the pass transistor circuit 1210 in FIG. 21.

The row decoder 1220a may include a mat decoder 1221a and a driving signal line decoder 1222a. Each of the pass transistor circuits 1210a and 1210b may include a plurality of pass transistors, e.g., a pass transistor TRs, first through n-th pass transistors TR1 through TRn, and a pass transistor TRg, where "n" may be a positive integer. The pass transistor circuit 1210a may be provided for each of mats, and the mat decoder 1221a and the driving signal line decoder 1222a may be provided in common for the mats.

The mat decoder 1221a may be connected to the pass transistor circuit 1210a through a mat selection signal line MS1. For example, the mat selection signal line MS1 may be connected to respective gates of the pass transistors, e.g., the pass transistor TRs, the first through n-th pass transistors TR1 through TRn, and the pass transistor TRg in the pass transistor circuit 1210a. The mat decoder 1221a may be connected to the pass transistor circuit 1210b through a mat selection signal line MS2. For example, the mat selection signal line MS2 may be connected to respective gates of the pass transistors, e.g., the pass transistor TRs, the first through n-th pass transistors TR1 through TRn, and the pass transistor TRg in the pass transistor circuit 1210b. When a mat selection signal provided through the mat selection signal line MS1 or the mat selection signal line MS2 is activated, or two mat selection signals provided through the mat selection signal line MS1 and the mat selection signal line MS2 are activated, the pass transistors, e.g., the pass transistor TRs, the first through n-th pass transistors TR1 through TRn, and the pass transistor TRg, are turned on, and accordingly, one or two of the mats MAT1 and MAT2 may be selected. For example, in a single mat mode, one of the mats MAT1 and MAT2 may be selected, and in a multi-mat mode, both of the mats MAT1 and MAT2 may be selected in response to mat selection signals.

The driving signal line decoder 1222a may be connected to the pass transistor circuits 1210a and 1210b through a string selection line driving signal line SS, first through n-th word line driving signal lines SI1 through SIn, and a ground selection line driving signal line GS. For example, the string selection line driving signal line SS, the first through n-th word line driving signal lines SI1 through SIn, and the ground selection line driving signal line GS may be respectively connected to respective sources of the pass transistors, e.g., the pass transistor TRs, the first through n-th pass transistors TR1 through TRn, and the pass transistor TRg. For example, the first word line driving signal line SI1 may be connected to the first pass transistor TR1, the second word line driving signal line SI2 may be connected to the second pass transistor TR2, and the n-th word line driving signal line SIn may be connected to the n-th pass transistor TRn of the pass transistor circuits 1210a and 1210b.

Each of the pass transistor circuits 1210a and 1210b may be connected to first and second mats MAT1 and MAT2 through a ground selection line GSL, first through n-th word lines WL1 through WLn, and a string selection line SSLu. The first through n-th pass transistors TR1 through TRn may respectively connect the first through n-th word lines WL1 through WLn to the first through n-th word line driving signal lines SI1 through SIn. For example, the first pass transistor TR1 may be connected to the first word line WL1 and may connect the first word line WL1 to the first word line driving signal line SI1. The second pass transistor TR2 may be connected to the second word line WL2 and may connect the second word line WL2 to the second word line driving signal line SI2. The n-th pass transistor TRn may be connected to the n-th word line WLn and may connect the n-th word line WLn to the n-th word line driving signal line SIn.

The pass transistor TRs may connect the string selection line SSLu to the string selection line driving signal line SS corresponding to the string selection line SSLu. The pass transistor TRg may connect the ground selection line GSL to the ground selection line driving signal line GS corresponding to the ground selection line GSL. For example, when a mat selection signal is activated, the pass transistor TRs, the first through n-th pass transistors TR1 through TRn, and the pass transistor TRg may respectively provide driving signals, which are respectively provided through the string selection line driving signal line SS, the first through n-th word line driving signal lines SI1 through SIn, and the ground selection line driving signal line GS, to the string selection line SSLu, the first through n-th word lines WL1 through WLn, and the ground selection line GSL.

In some example embodiments, the pass transistor TRs and the first through n-th pass transistors TR1 through TRn may be implemented as vertical pass transistors. In this specification, the term "vertical pass transistor" refers to a transistor including a vertical channel. For example, the pass transistor TRs and the first through n-th pass transistors TR1 through TRn may be in a stair area (e.g., SA in FIG. 22) of word lines. In some example embodiments, the pass transistor TRg may be implemented as a normal pass transistor. For example, the pass transistor TRg may be in a second semiconductor layer (e.g., 1400 in FIG. 22). This will be described with reference to the drawings including FIG. 27A.

Figure 24:
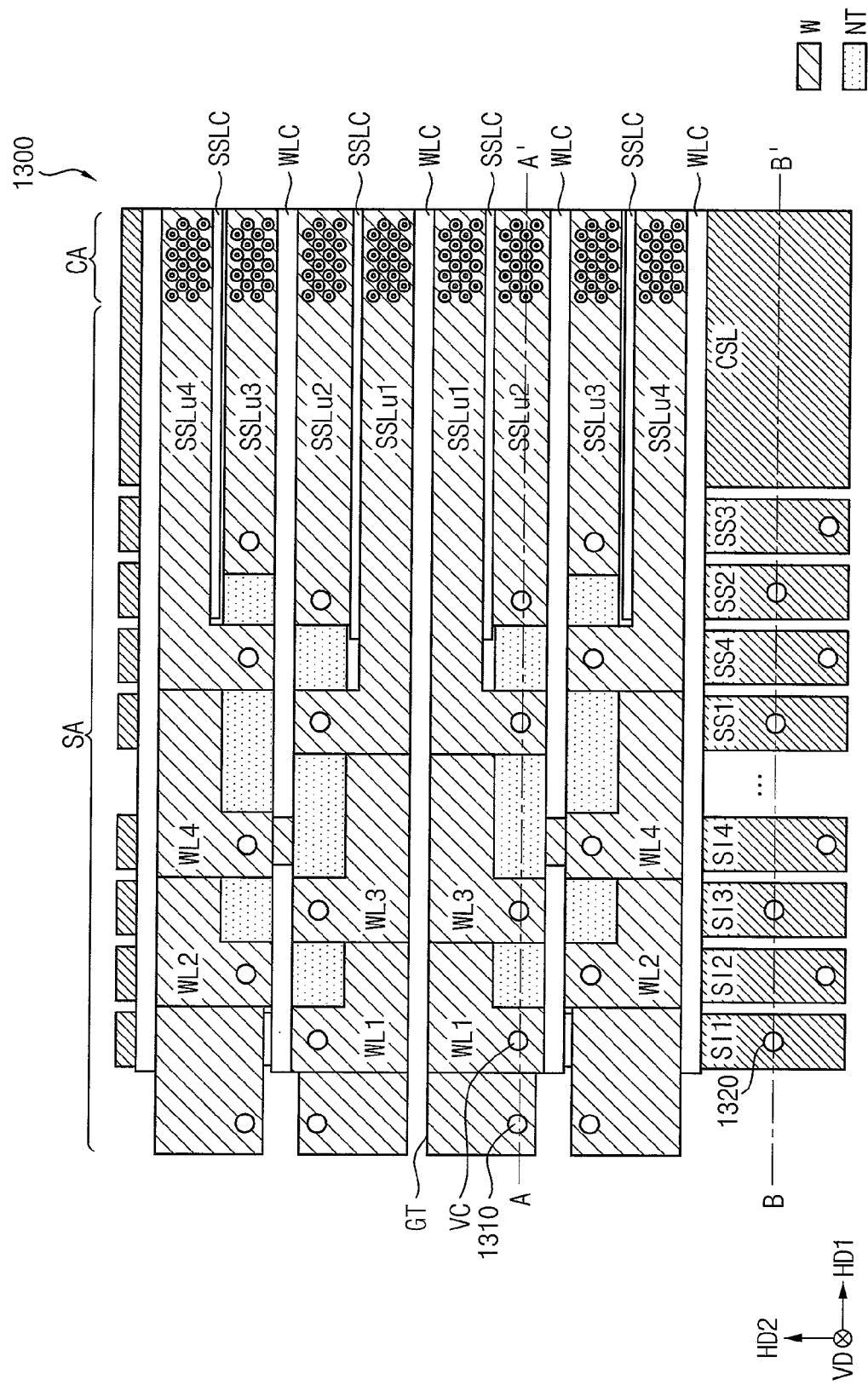
FIG. 24 is a diagram of the memory device including the pass transistor circuit in FIG. 23, according to some example embodiments.
Figure 26:
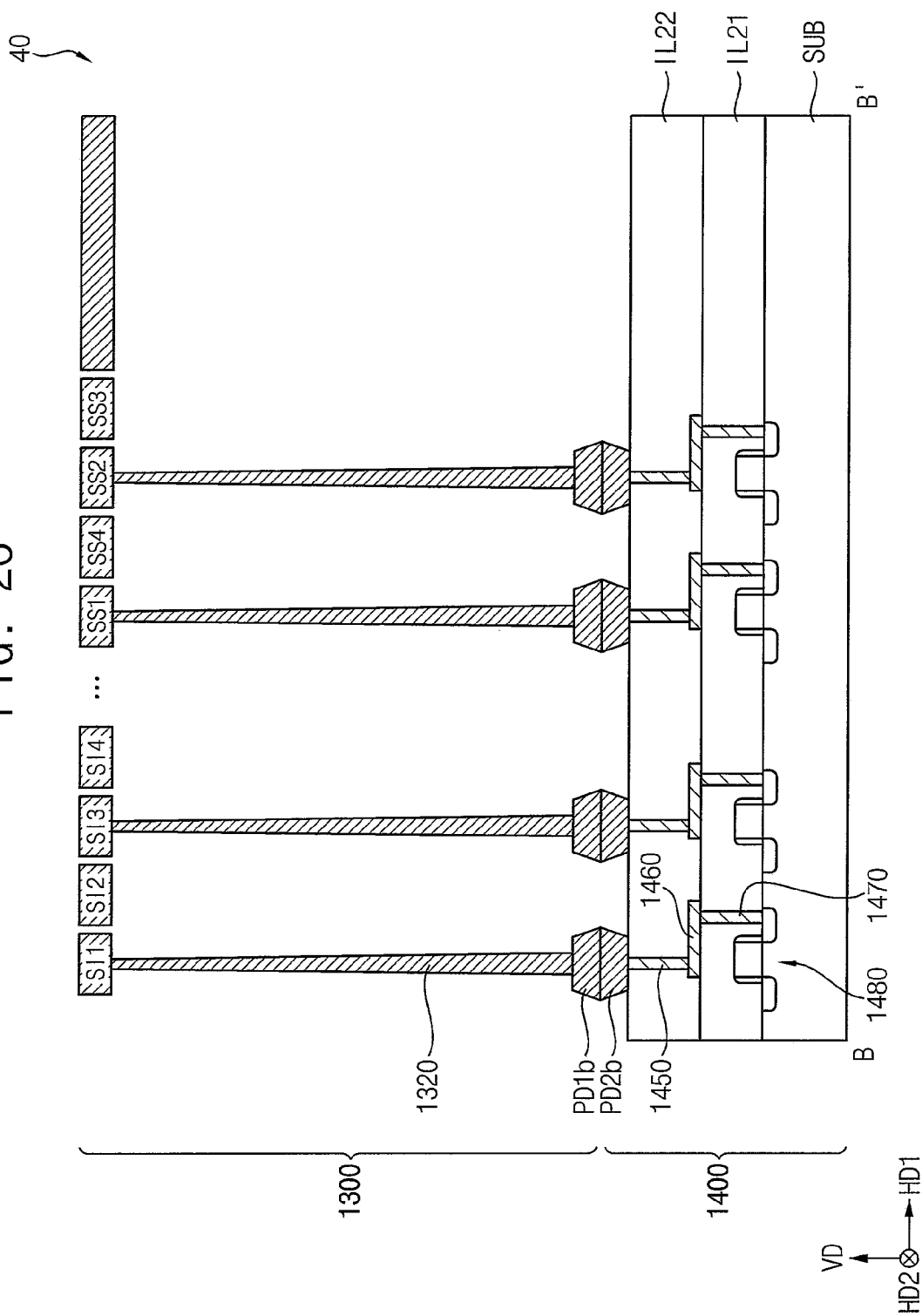
FIG. 26 is a cross-sectional view taken along a line B-B' of FIG. 24, according to some example embodiments.

FIG. 24 is a diagram of the memory device including the pass transistor circuit in FIG. 23, according to some example embodiments. FIG. 25 is a cross-sectional view taken along a line A-A' of FIG. 24, according to some example embodiments. FIG. 26 is a cross-sectional view taken along a line B-B' of FIG. 24, according to some example embodiments. In detail, FIG. 24 is a diagram of the first semiconductor layer of the memory device of FIG. 22, which is viewed from below in the vertical direction VD.

Referring to FIGS. 24 and 25, the first semiconductor layer 1300 of the memory device 40 may include a plurality of word lines, e.g., the first through n-th word lines WL1 through WLn. The first through n-th word lines WL1 through WLn may be sequentially stacked in the vertical direction VD and may extend in the first horizontal direction HD1. Although not shown, the first through n-th word lines WL1 through WLn may be electrically insulated by a plurality of insulating layers. Respective ends of the first through n-th word lines WL1 through WLn in the first horizontal direction HD1 may be implemented in a stair shape in the stair area SA.

Each of the first through n-th word lines WL1 through WLn may include a conductive region W and an insulating region NT contact to each other in the stair area SA. For example, each of the first through n-th word lines WL1 through WLn may include the conductive region W, which is in contact with a contact CP corresponding to each word line, and the insulating region NT, which is in contact with a contact CP not corresponding thereto (e.g., a contact CP connected to another word line).

Here, the conductive region W may include a conductive material such as tungsten but is not limited to tungsten. The insulating region NT may include an insulating material such as nitride but is not limited to nitride.

The first word line WL1 may be below a gate GT, and the second through n-th word lines WL2 through WLn may be sequentially formed below the first word line WL1 in the vertical direction VD.

Each of the first through n-th word lines WL1 through WLn may be connected to a vertical channel VC corresponding thereto through the contact CP corresponding thereto. For example, the vertical channel VC corresponding to the first word line WL1 may be connected to the first word line driving signal line SI1, the vertical channel VC corresponding to the second word line WL2 may be connected to the second word line driving signal line SI2, the vertical channel VC corresponding to the third word line WL3 may be connected to the third word line driving signal line SI3, and the vertical channel VC corresponding to the fourth word line WL4 may be connected to the fourth word line driving signal line SI4. The first through n-th word lines WL1 through WLn may extend in the first horizontal direction HD1, and a word line at one level may be divided by a word line cut region WLC.

The first semiconductor layer 1300 of the memory device 40 may include the ground selection line GSL disposed above the first through n-th word lines WL1 through WLn and the common source line CSL disposed above the ground selection line GSL. In some example embodiments, a plurality of driving signal lines, e.g., the first through fourth word line driving signal lines SI1 through SI4 and first through fourth string selection line driving signal lines SS1 through SS4, and the common source line CSL may be arranged in the same level (i.e., the same layer). For example, a plurality of driving signal lines, e.g., the first through fourth word line driving signal lines SI1 through SI4 and first through fourth string selection line driving signal lines SS1 through SS4, and the common source line CSL may be formed by the same process. In some example embodiments, a plurality of driving signal lines, e.g., the first through fourth word line driving signal lines SI1 through SI4 and the first through fourth string selection line driving signal lines SS1 through SS4, may extend in the second horizontal direction HD2 and may be apart from one another in the first horizontal direction HD1. In some example embodiments, the common source line CSL may extend in the second horizontal direction HD2 and may be implemented by a metal plate. Although only the first through fourth word line driving signal lines SI1 through SI4 are illustrated in FIGS. 24 and 25 for convenience of description, the first through n-th word line driving signal lines SI1 through SIn may be included in the memory device 40 to respectively correspond to the first through n-th word lines WL1 through WLn, thereby respectively providing corresponding word line driving signals to the first through n-th word lines WL1 through WLn.

The first semiconductor layer 1300 of the memory device 40 may further include string selection lines SSLu below the first through n-th word lines WL1 through WLn. For example, the string selection lines SSLu may include first through fourth string selection lines SSLu1 through SSLu4. The first through fourth string selection lines SSLu1 through SSLu4 may be arranged in the same level and may be separated from each other by a string selection line cut region SSLC. Each of the first through fourth string selection lines SSLu1 through SSLu4 may be connected to the vertical channel VC corresponding thereto through the contact CP corresponding thereto. The vertical channel VC corresponding to the first string selection line SSLu1 may be connected to the first string selection line driving signal line SS1, the vertical channel VC corresponding to the second string selection line SSLu2 may be connected to the second string selection line driving signal line SS2, the vertical channel VC corresponding to the third string selection line SSLu3 may be connected to the third string selection line driving signal line SS3, and the vertical channel VC corresponding to the fourth string selection line SSLu4 may be connected to the fourth string selection line driving signal line SS4.

Although it is illustrated in FIG. 25 that the memory device 40 includes the string selection line SSLu of one layer, embodiments are not limited thereto. In some example embodiments, the memory device 40 may include two string selection lines (e.g., SSLu and SSLd in FIG. 27A) stacked in the vertical direction VD.

In some example embodiments, the ground selection line GSL, the string selection line SSLu, and the gate GT may include the same material as the first through n-th word lines WL1 through WLn. For example, the ground selection line GSL, the string selection line SSLu, and the gate GT may include the same material as the conductive region W.

A plurality of vertical channel structures VP may be in the channel area CA of the first semiconductor layer 1300, and a memory cell array may be formed in the channel area CA. The plurality of vertical channel structures VP may extend in the vertical direction VD and penetrate through the first through n-th word lines WL1 through WLn and a plurality of insulating layers formed among the first through n-th word lines WL1 through WLn. The plurality of vertical channel structures VP may be referred to as a vertical pillar. In some example embodiments, each of the plurality of vertical channel structures VP may have a first width VPW in the first horizontal direction HD1. For example, each of the plurality of vertical channel structures VP may have an annular shape. In this case, the first width VPW may correspond to a first channel hole size. However, embodiments are not limited thereto. Each of the plurality of vertical channel structures VP may have an elliptic pillar shape or a quadrangular pillar shape. A plurality of vertical channel structures VP may be spaced apart from each other in the first horizontal direction HD1 and the second horizontal direction HD2.

In some example embodiments, each of the vertical channel structures VP may include a charge storage layer, a channel layer, and an inner layer. The channel layer may include a silicon material having a first type (e.g., a P type) and may function as a channel area. The inner layer may include an insulating material, such as silicon oxide, or an air gap. The charge storage layer may include a gate insulating layer (or referred to as a "tunneling insulating layer"), a charge trap layer, and/or a blocking insulating layer. For example, the charge storage layer may have an oxide-nitride-oxide (ONO) structure.

Drains or drain contacts may be respectively provided below the vertical channel structures VP. For example, the drains or the drain contacts may include a silicon material doped with impurities having a second conductivity type (e.g., an N type). Bit lines (e.g., BL in FIG. 22) may be provided below the drain contacts and may respectively connected to the drain contacts through bit line contacts. Each of the bit lines may be connected to the page buffer circuit in the second semiconductor layer 1400 through a pad.

A plurality of vertical pass transistors, e.g., first and third vertical pass transistors TR1 and TR3 and vertical pass transistors TRs1 and TRs2, may be in the stair area SA. Although only the first and third vertical pass transistors TR1 and TR3 and the vertical pass transistors TRs1 and TRs2 are illustrated in FIG. 25 for convenience of description, the second and fourth through n-th pass transistors TR2 and TR4 through TRn in FIG. 23 may be formed in the stair area SA as vertical pass transistors, and the descriptions of the first and third vertical pass transistors TR1 and TR3 and the vertical pass transistors TRs1 and TRs2 may also be applied to the second and fourth through n-th pass transistors TR2 and TR4 through TRn.

Each of the first and third vertical pass transistors TR1 and TR3 and the vertical pass transistors TRs1 and TRs2 may be connected to a corresponding line among the first through n-th word lines WL1 through WLn and the string selection lines SSLu and to a corresponding one of a plurality of driving signal lines, e.g., the first through fourth word line driving signal lines SI1 through SI4 and the first through fourth string selection line driving signal lines SS1 through SS4. For example, the first vertical pass transistor TR1 may be connected between the first word line WL1 and the first word line driving signal line SI1, and the third vertical pass transistor TR3 may be connected between the third word line WL3 and the third word line driving signal line SI3. The vertical pass transistor TRs1 may be connected between the first string selection line SSLu1 and the first string selection line driving signal line SS1, and the vertical pass transistor TRs2 may be connected between the second string selection line SSLu2 and the second string selection line driving signal line SS2.

Each of the first and third vertical pass transistors TR1 and TR3 and the vertical pass transistors TRs1 and TRs2 may include the vertical channel VC extending in the vertical direction VD. In some example embodiments, a plurality of vertical channels VC may have the same height, e.g., a first height VCH, in the vertical direction VD. In some example embodiments, bottom levels of the vertical channels VC may be higher than a top level of the first word line WL1, which is at the top among the first through n-th word lines WL1 through WLn. For example, the bottom levels of the vertical channels VC may be between the first word line WL1 and the ground selection line GSL.

The vertical channels VC may have a second width VCW in the first horizontal direction HD1. In some example embodiments, the second width VCW may be greater than the first width WPW of the vertical channel structures VP. Accordingly, a breakdown issue of the first and third vertical pass transistors TR1 and TR3 and the vertical pass transistors TRs1 and TRs2 may be resolved. For example, the second width VCW may be at least about twice the first width VPW. However, embodiments are not limited thereto. The first width VPW and the second width VCW may vary with embodiments.

In some example embodiments, the vertical channels VC may be formed in the same structure using the same process as the vertical channel structures VP. Therefore, like the vertical channel structures VP, the vertical channels VC may include a charge storage layer, a channel layer, and an inner layer. However, embodiments are not limited thereto. In some example embodiments, the vertical channels VC may include only a channel layer and an inner layer.

The vertical channels VC respectively included in the first and third vertical pass transistors TR1 and TR3 and the vertical pass transistors TRs1 and TRs2 may be connected in common to the gate GT. In some example embodiments, the gate GT connected in common to the first and third vertical pass transistors TR1 and TR3 and the vertical pass transistors TRs1 and TRs2 may be at the same level as the ground selection line GSL.

In some example embodiments, the vertical channels VC respectively included in the first and third vertical pass transistors TR1 and TR3 and the vertical pass transistors TRs1 and TRs2 may be respectively connected to different gates. In this case, the different gates may have different lengths in the vertical direction VD, and the first and third vertical pass transistors TR1 and TR3 and the vertical pass transistors TRs1 and TRs2 may have different driving performance.

In some example embodiments, a first length LG1 of the gate GT may be substantially the same as a second length LG2 of the ground selection line GSL in the vertical direction VD. In some example embodiments, a third length LS1 of an insulating layer between the gate GT and the first word line WL1 may be substantially the same as a fourth length LS2 of an insulating layer between the ground selection line GSL and the first word line WL1 in the vertical direction VD. However, embodiments are not limited thereto. The first length LG1 may be different from the second length LG2, and the third length LS1 may be different from the fourth length LS2.

In some example embodiments, the second length LG2 of the ground selection line GSL may be substantially the same as a length of each of the first through n-th word lines WL1 through WLn in the vertical direction VD, but embodiments are not limited thereto. In some example embodiments, the second length LG2 may be substantially the same as a length of the string selection line SSLu in the vertical direction VD, but embodiments are not limited thereto.

The contact CP may be placed in each of the first and third vertical pass transistors TR1 and TR3 and the vertical pass transistors TRs1 and TRs2. Each of the first and third vertical pass transistors TR1 and TR3 and the vertical pass transistors TRs1 and TRs2 may be connected to a corresponding line among the first through n-th word lines WL1 through WLn and the string selection lines SSLu through the contact CP corresponding thereto. For example, the first vertical pass transistor TR1 may be connected to the first word line WL1 through the contact CP corresponding to the first vertical pass transistor TR1, and the third vertical pass transistor TR3 may be connected to the third word line WL3 through the contact CP corresponding to the third vertical pass transistor TR3. The vertical pass transistor TRs1 may be connected to the first string selection line SSLu1 through the contact CP corresponding to the vertical pass transistor TRs1, and the vertical pass transistor TRs2 may be connected to the second string selection line SSLu2 through the contact CP corresponding to the vertical pass transistor TRs2.

In some example embodiments, a plurality of contacts CP respectively connected to the vertical channels VC may have the same height, e.g., a second height CPH, in the vertical direction VD. Accordingly, the contacts CP may be easily formed in the memory device 40.

Referring to FIGS. 25 and 26, the second semiconductor layer 1400 may include a substrate SUB, a first lower insulating layer IL21, and/or a second lower insulating layer IL22. The first semiconductor layer 1300 may be combined with the second semiconductor layer 1400 by C2C wafer bonding. In this case, a plurality of bonding pads PD1*a* and PD1*b* may be formed on a first surface of the first semiconductor layer 1300, and a plurality of bonding pads PD2*a* and PD2*b* may be formed on a first surface of the second semiconductor layer 1400. The first surface of the first semiconductor layer 1300 may be bonded to the first surface of the second semiconductor layer 1400 through the plurality of bonding pads PD1*a*, PD1*b*, PD2*a*, and PD2*b*. In some example embodiments, an I/O pad forming process and a back-lap process may be sequentially performed on a second surface opposite the first surface of the first semiconductor layer 1300.

The gate GT may be connected to a transistor 1440 through an interconnection, which includes a first contact 1310, a metal pattern 1330, and the bonding pad PD1*a* that are included in the first semiconductor layer 1300 and the bonding pad PD2*a*, contacts 1410 and 1430, and a metal pattern 1420 that are included in the second semiconductor layer 1400. The first word line driving signal line SI1 may be connected to a transistor 1480 through an interconnection, which includes a contact 1320 and the bonding pad PD1*b* that are included in the first semiconductor layer 1300 and the bonding pad PD2*b*, contacts 1450 and 1470, and a metal pattern 1460 that are included in the second semiconductor layer 1400. Also, each of a plurality of driving signal lines (e.g., SI2 through SI4 and SS1 through SS4) except for the first word line driving signal line SI1 may be connected to a transistor through an interconnection, which includes a contact CP and a bonding pad that are included in the first semiconductor layer 1300 and a bonding pad, a contact, and a metal pattern that are included in the second semiconductor layer 1400.

In some example embodiments, at least a portion of a row decoder (e.g., 1220*a* in FIG. 23) may be below vertical pass transistors (e.g., TR1, TR3, TRs1, and TRs2) in the vertical direction VD. For example, at least one selected from the mat decoder 1221*a* and the driving signal line decoder 1222*a* in FIG. 23 may be below the vertical pass transistors (e.g., TR1, TR3, TRs1, and TRs2) in the vertical direction VD and may include the transistor 1440.

Figure 27B:
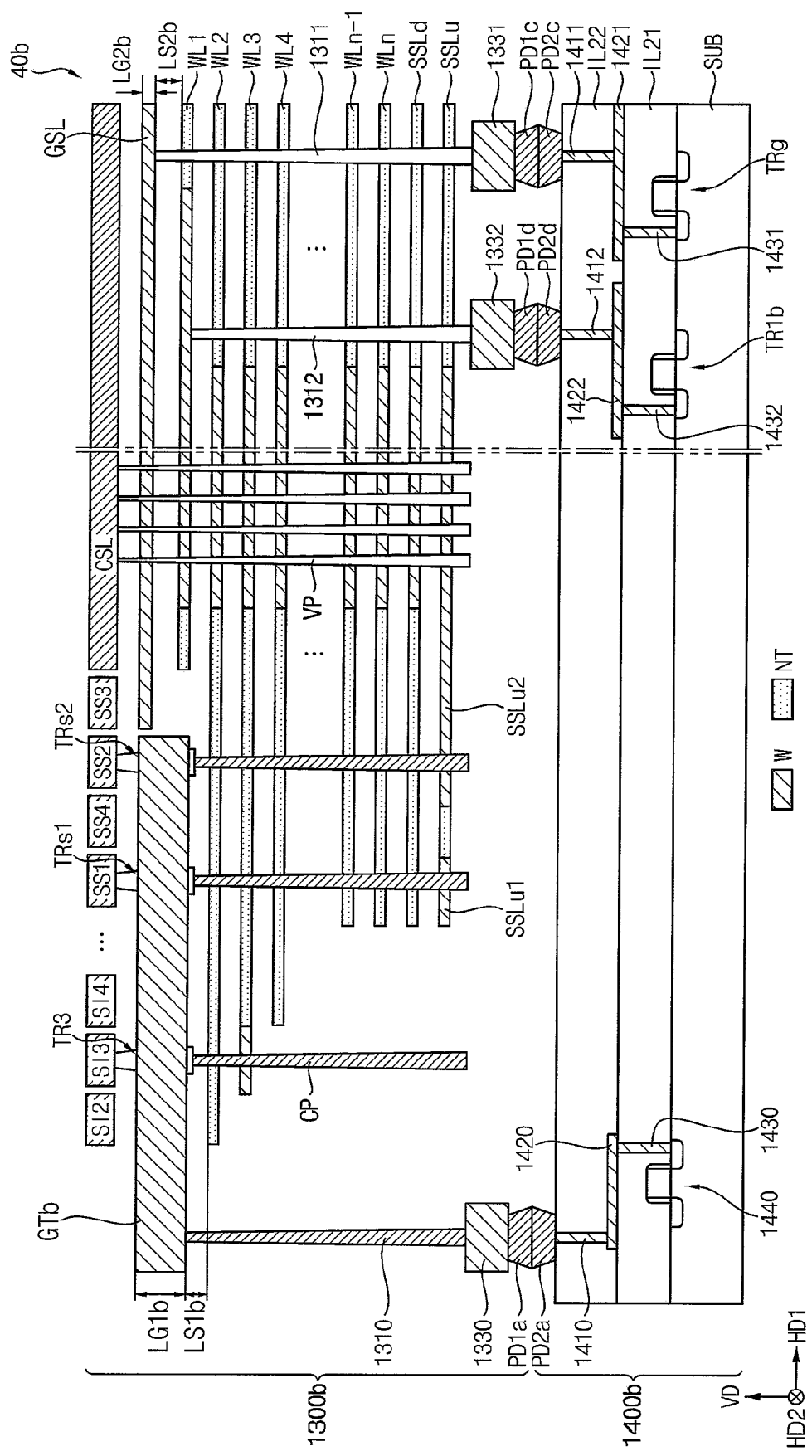
Figure 27C:
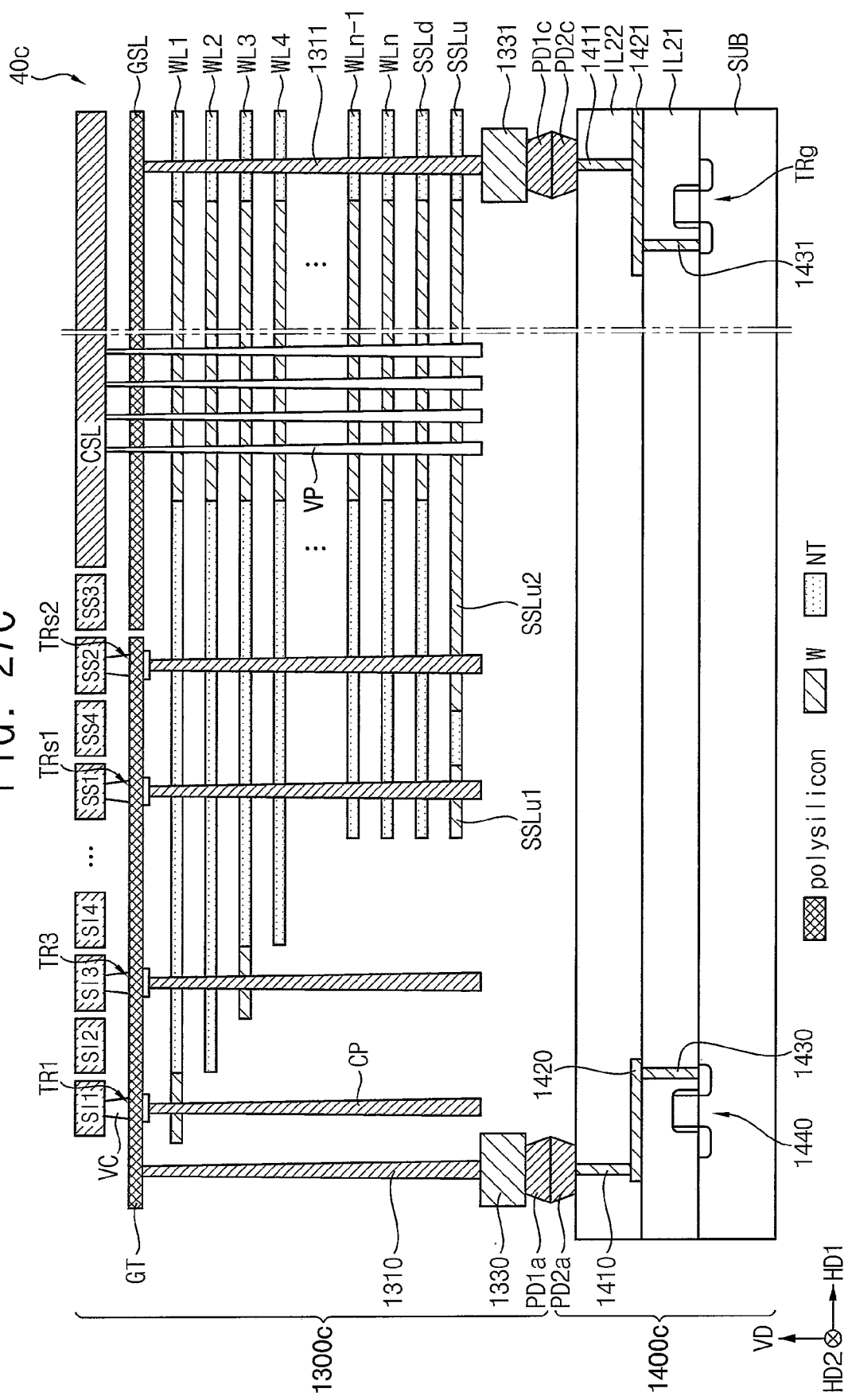

FIGS. 27A through 27C are diagrams of memory devices including the pass transistor circuit in FIG. 23 respectively, according to example embodiments. Redundant descriptions of like numerals in FIGS. 25, 26 and 27A through 27C will be omitted.

Referring to FIG. 27A, a memory device 40*a* may include an upper string selection line SSLd, which are stacked on the string selection lines SSLu. Therefore, the string selection lines SSLu described above may be represented by the lower string selection lines SSLu in FIGS. 27A through 27C. For example, the upper string selection line SSLd may be stacked on the lower string selection lines SSLu in the vertical direction VD. The lower string selection lines SSLu may include a first lower string selection line SSLu1 and a second lower string selection line SSLu2, which are located at the same level. A plurality of vertical channel structures VP may extend in the vertical direction VD and penetrate through the ground selection line GSL, the first through n-th word lines WL1 through WLn, the upper string selection line SSLd, and/or the lower string selection lines SSLu.

In the memory device 40*a*, some of a plurality of pass transistors (e.g., TRs, TR1 through TRn, and TRg in FIG. 23) may be formed as vertical pass transistors in a first semiconductor layer 1300*a*, and the others of the pass transistors may be formed as normal pass transistors in a second semiconductor layer 1400*a*. For example, the pass transistor TRg connected to the ground selection line GSL, which is in the same layer as the gate GT among the ground selection line GSL, the first through n-th word lines WL1 through WLn, the upper string selection line SSLd, and the lower string selection lines SSLu, may be formed as a normal pass transistor in the second semiconductor layer 1400*a*. The ground selection line GSL may be connected to the pass transistor TRg through an interconnection, which includes a second contact 1311, a metal pattern 1331, and a bonding pad PD1*c* that are included in the first semiconductor layer 1300*a* and a bonding pad PD2*c*, contacts 1411 and 1431, and a metal pattern 1421 that are included in the second semiconductor layer 1400*a*.

The second contact 1311 may extend in the vertical direction VD to be in contact with the ground selection line GSL and may penetrate through the first through n-th word lines WL1 through WLn, the upper string selection line SSLd, and the lower string selection lines SSLu. The first through n-th word lines WL1 through WLn, the upper string selection line SSLd, and the lower string selection lines SSLu may include the insulating region NT contacting the second contact 1311 and may thus be insulated from the second contact 1311.

In the memory device 40*a*, the gate GT connected in common to a plurality of vertical pass transistors (e.g., TR1, TR3, TRs1, and TRs2) is formed at the same level as the ground selection line GSL, and therefore, the pass transistor TRg connected to the ground selection line GSL may be formed in the second semiconductor layer 1400*a*. However, embodiments are not limited thereto. The pass transistor TRg connected to the ground selection line GSL may be formed in the first semiconductor layer 1300*a* as a normal transistor or a vertical pass transistor.

Referring to FIG. 27B, a memory device 40*b* may include a gate GTb forming the third vertical pass transistor TR3 and the vertical pass transistors TRs1 and TRs2. In some example embodiments, a first length LG1*b* of the gate GTb may be different from a second length LG2*b* of the ground selection line GSL in the vertical direction VD. For example, the first length LG1*b* of the gate GTb may be greater than the second length LG2*b* of the ground selection line GSL. In some example embodiments, a third length LS1*b* of an insulating layer between the gate GTb and the second word line WL2 may be different from a fourth length LS2*b* of an insulating layer between the ground selection line GSL and the first word line WL1 in the vertical direction VD.

When the first length LG1*b* of the gate GTb in the vertical direction VD increases, a high voltage may be applied to the gate electrode of the third vertical pass transistor TR3 and the vertical pass transistors TRs1 and TRs2, i.e., the gate GTb, and the driving speed of the third vertical pass transistor TR3 and the vertical pass transistors TRs1 and TRs2 may be increased. In addition, a breakdown issue of the first and third vertical pass transistors TR1 and TR3 and the vertical pass transistors TRs1 and TRs2 may be resolved.

In some example embodiments, the pass transistor TRg and a first pass transistor TR1b of the memory device 40*b* may be in a second semiconductor layer 1400*b* and may be normal pass transistors. For example, the ground selection line GSL may be connected to the pass transistor TRg through an interconnection, which includes the second contact 1311, the metal pattern 1331, and the bonding pad PD1*c* that are included in a first semiconductor layer 1300*b* and the bonding pad PD2*c*, the contacts 1411 and 1431, and the metal pattern 1421 that are included in the second semiconductor layer 1400*b*. For example, the first word line WL1 may be connected to the first pass transistor TR1*b* through an interconnection, which includes a third contact 1312, a metal pattern 1332, and a bonding pad PD1*d* that are included in the first semiconductor layer 1300*b* and a bonding pad PD2*d*, contacts 1412 and 1432, and a metal pattern 1422 that are included in the second semiconductor layer 1400*b*.

The third contact 1312 may extend in the vertical direction VD to be in contact with the first word line WL1 and may penetrate through the second through n-th word lines WL2 through WLn, the upper string selection line SSLd, and the lower string selection lines SSLu. Each of the second through n-th word lines WL2 through WLn, the upper string selection line SSLd, and the lower string selection lines SSLu may include the insulating region NT contacting the third contact 1312. Accordingly, the second through n-th word lines WL2 through WLn, the upper string selection line SSLd, and the lower string selection lines SSLu may be insulated from the third contact 1312.

Although it has been described with reference to FIG. 27B that the pass transistor TRg and the first pass transistor TR1*b* are in the second semiconductor layer 1400*b*, embodiments are not limited thereto. When a dummy word line is formed between the ground selection line GSL and the first word line WL1, a pass transistor connected to the dummy word line may be in the second semiconductor layer 1400*b*.

Referring to FIG. 27C, in a memory device 40*c*, the gate GT and the ground selection line GSL, which are formed in a first semiconductor layer 1300*c*, may be formed of a different material than the first through n-th word lines WL1 through WLn. For example, the gate GT and the ground selection line GSL may include polysilicon and the first through n-th word lines WL1 through WLn may include tungsten. However, this is just an example, and the gate GT and the ground selection line GSL may include various materials.

Since the gate GT and the ground selection line GSL are formed of a different material than that of the first through n-th word lines WL1 through WLn in the memory device 40*c*, when the ground selection line GSL, the second through n-th word lines WL2 through WLn, the upper string selection line SSLd, and the lower string selection lines SSLu are partially etched to form the word line cut region WLC, the gate GT and the ground selection line GSL may limit etching and prevent overetch.

Figure 28:
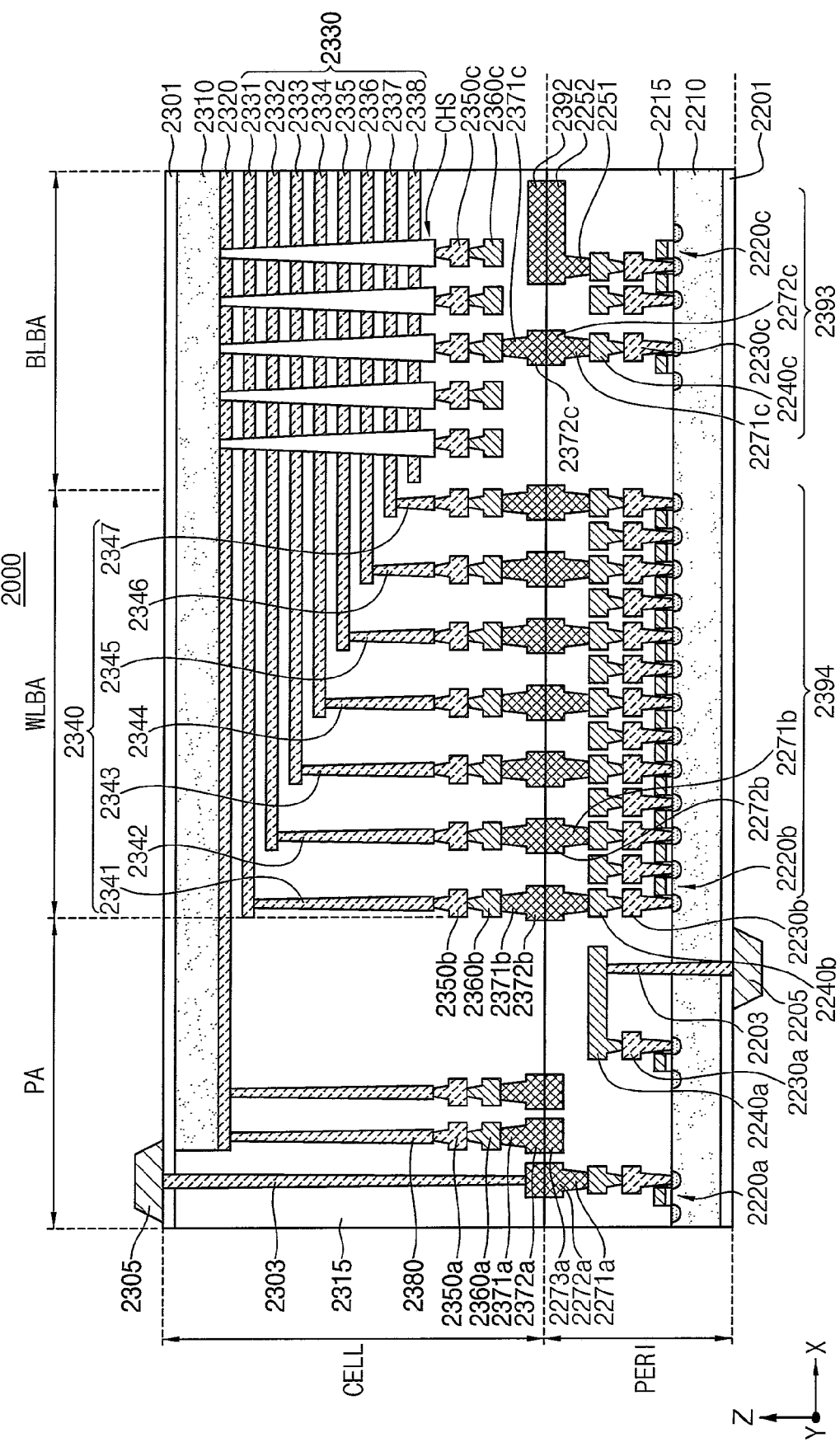
FIG. 28 is a cross-sectional view illustrating a memory device according to some embodiments.

FIG. 28 is a cross-sectional view illustrating a memory device according to some embodiments.

Referring to FIG. 28, a memory device 2000 may have a chip-to-chip (C2C) structure. The C2C structure may refer to a structure formed by manufacturing an upper chip including a cell region (or memory cell region) CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 2000 may include an external pad bonding area PA, a word line bonding area WLBA, and a bit line bonding area BLBA.

The peripheral circuit region PERI may include a first substrate 2210, an interlayer insulating layer 2215, a plurality of circuit elements 2220*a*, 2220*b*, and 2220*c* formed on the first substrate 2210, first metal layers 2230*a*, 2230*b*, and 2230*c* respectively connected to the plurality of circuit elements 2220*a*, 2220*b*, and 2220*c*, and second metal layers 2240*a*, 2240*b*, and 2240*c* formed on the first metal layers 2230*a*, 2230*b*, and 2230*c*. Each of the circuit elements 2220a, 2220*b*, and 2220*c* may include one or more transistors. In an example embodiment, the first metal layers 2230*a*, 2230*b*, and 2230*c* may be formed of tungsten having relatively high resistance, and the second metal layers 2240*a*, 2240*b*, and 2240*c* may be formed of copper having relatively low resistance.

In an example embodiment illustrate in FIG. 28, although the first metal layers 2230*a*, 2230*b*, and 2230*c* and the second metal layers 2240*a*, 2240*b*, and 2240*c* are shown and described, they are not limited thereto, and one or more metal layers may be further formed on the second metal layers 2240*a*, 2240*b*, and 2240*c*. At least a portion of the one or more metal layers formed on the second metal layers 2240*a*, 2240*b*, and 2240*c* may be formed of aluminum or the like having a lower resistance than those of copper forming the second metal layers 2240*a*, 2240*b*, and 2240*c*.

The interlayer insulating layer 2215 may be disposed on the first substrate 2210 and cover the plurality of circuit elements 2220*a*, 2220*b*, and 2220*c*, the first metal layers 2230*a*, 2230*b*, and 2230*c*, and the second metal layers 2240*a*, 2240*b*, and 2240*c*. The interlayer insulating layer 2215 may include an insulating material such as silicon oxide, silicon nitride, or the like.

Lower bonding metals 2271*b* and 2272*b* may be formed on the second metal layer 2240*b* in the word line bonding area WLBA. In the word line bonding area WLBA, the lower bonding metals 2271*b* and 2272*b* in the peripheral circuit region PERI may be electrically connected to upper bonding metals 2371*b* and 2372*b* in the cell region CELL in a bonding manner, and the lower bonding metals 2271*b* and 2272*b* and the upper bonding metals 2371*b* and 2372*b* may be formed of aluminum, copper, tungsten, or the like.

The upper bonding metals 2371*b* and 2372*b* in the cell region CELL may be referred as first metal pads and the lower bonding metals 2271*b* and 2272*b* in the peripheral circuit region PERI may be referred as second metal pads. In some examples, the first metal pads and the second metal pads may be connected with each other in the bonding manner.

The cell region CELL may include at least one memory block. The cell region CELL may include a second substrate 2310 and a common source line 2320. On the second substrate 2310, a plurality of word lines 2331 to 2338 (i.e., 2330) may be stacked in a direction (a Z-axis direction), perpendicular to an upper surface of the second substrate 2310. At least one string select line and at least one ground select line may be arranged on and below the plurality of word lines 2330, respectively, and the plurality of word lines 2330 may be disposed between the at least one string select line and the at least one ground select line.

In the bit line bonding area BLBA, a channel structure CHS may extend in a direction, perpendicular to the upper surface of the second substrate 2310, and pass through the plurality of word lines 2330, the at least one string select line, and the at least one ground select line. The channel structure CHS may include a data storage layer, a channel layer, a buried insulating layer, and the like, and the channel layer may be electrically connected to a third metal layer 2350c and a fourth metal layer 2360c. For example, the third metal layer 2350c may be a bit line contact, and the fourth metal layer 2360c may be a bit line. In an example embodiment, the bit line 2360c may extend in a first direction (a Y-axis direction), parallel to the upper surface of the second substrate 2310.

In an example embodiment illustrated in FIG. 28, an area in which the channel structure CHS, the bit line 2360c, and the like are disposed may be defined as the bit line bonding area BLBA. In the bit line bonding area BLBA, the bit line 2360c may be electrically connected to the circuit elements 2220c providing a page buffer circuit 2393 in the peripheral circuit region PERI. For example, the bit line 2360c may be connected to upper bonding metals 2371c and 2372c in the cell region CELL, and the upper bonding metals 2371c and 2372c may be connected to lower bonding metals 2271c and 2272c connected to the circuit elements 2220c of the page buffer circuit 2393.

In the word line bonding area WLBA, the plurality of word lines 2330 may extend in a second direction (an X-axis direction), parallel to the upper surface of the second substrate 2310, and may be connected to a plurality of cell contact plugs 2341 to 2347 (i.e., 2340). The plurality of word lines 2330 and the plurality of cell contact plugs 2340 may be connected to each other in pads provided by at least a portion of the plurality of word lines 2330 extending in different lengths in the second direction. A third metal layer 2350b and a fourth metal layer 2360b may be connected to an upper portion of the plurality of cell contact plugs 2340 connected to the plurality of word lines 2330, sequentially. The plurality of cell contact plugs 2340 may be connected to the circuit region PERI by the upper bonding metals 2371b and 2372b of the cell region CELL and the lower bonding metals 2271b and 2272b of the peripheral circuit region PERI in the word line bonding area WLBA.

The plurality of cell contact plugs 2340 may be electrically connected to the circuit elements 2220b providing a row decoder 2394 in the peripheral circuit region PERI. In an example embodiment, operating voltages of the circuit elements 2220b providing the row decoder 2394 may be different than operating voltages of the circuit elements 2220c providing the page buffer circuit 2393. For example, operating voltages of the circuit elements 2220c providing the page buffer 2393 may be greater than operating voltages of the circuit elements 2220b providing the row decoder 2394.

A common source line contact plug 2380 may be disposed in the external pad bonding area PA. The common source line contact plug 2380 may be formed of a conductive material such as a metal, a metal compound, polysilicon, or the like, and may be electrically connected to the common source line 2320. A third metal layer 2350a and a fourth metal layer 2360a may be stacked on an upper portion of the common source line contact plug 2380, sequentially. For example, an area in which the common source line contact plug 2380, the third metal layer 2350a, and the fourth metal layer 2360a are disposed may be defined as the external pad bonding area PA.

Input-output pads 2205 and 2305 may be disposed in the external pad bonding area PA. Referring to FIG. 28, a lower insulating film 2201 covering a lower surface of the first substrate 2210 may be formed below the first substrate 2210, and a first input-output pad 2205 may be formed on the lower insulating film 2201. The first input-output pad 2205 may be connected to at least one of the plurality of circuit elements 2220a, 2220b, and 2220c disposed in the peripheral circuit region PERI through a first input-output contact plug 2203, and the first input-output pad 2205 may be separated from the first substrate 2210 by the lower insulating film 2201. In addition, a side insulating film may be disposed between the first input-output contact plug 2203 and the first substrate 2210 to electrically separate the first input-output contact plug 2203 and the first substrate 2210.

Referring to FIG. 28, an upper insulating film 2301 covering the upper surface of the second substrate 2310 may be formed on the second substrate 2310, and a second input-output pad 2305 may be disposed on the upper insulating layer 2301. The second input-output pad 2305 may be connected to at least one of the plurality of circuit elements 2220a, 2220b, and 2220c disposed in the peripheral circuit region PERI through a second input-output contact plug 2303.

According to embodiments, the second substrate 2310 and the common source line 2320 may not be disposed in an area in which the second input-output contact plug 2303 is disposed. Also, the second input-output pad 2305 may not overlap the word lines 2330 in the third direction (the Z-axis direction). Referring to FIG. 28, the second input-output contact plug 2303 may be separated from the second substrate 2310 in a direction, parallel to the upper surface of the second substrate 2310, and may pass through an interlayer insulating layer 2315 of the cell region CELL to be connected to the second input-output pad 2305 and an upper bonding metal 2372a in the cell region CELL.

According to embodiments, the first input-output pad 2205 and the second input-output pad 2305 may be selectively formed. For example, the memory device 2000 may include only the first input-output pad 2205 disposed on the lower insulating film 2201 in contact with the first substrate 2210 or the second input-output pad 2305 disposed on the upper insulating film 2301 in contact with the second substrate 2310. Alternatively, the memory device 2000 may include both the first input-output pad 2205 and the second input-output pad 2305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 2000 may include a lower metal pattern 2273a, corresponding to the upper metal pattern 2372a formed in an uppermost metal layer of the cell region CELL, and having the same shape as the upper metal pattern 2372a of the cell region CELL, in an uppermost metal layer of the peripheral circuit region PERI. In the peripheral circuit region PERI, the lower metal pattern 2273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 2271b and 2272b may be formed on the second metal layer 2240b in the word line bonding area WLBA. In the word line bonding area WLBA, the lower bonding metals 2271b and 2272b of the peripheral circuit region PERI may be electrically connected to the upper bonding metals 2371*b* and 2372*b* of the cell region CELL by a Cu—Cu bonding.

Further, the bit line bonding area BLBA, an upper metal pattern 2392, corresponding to a lower metal pattern 2252 formed in the uppermost metal layer of the peripheral circuit region PERI, and having the same shape as the lower metal pattern 2252 of the peripheral circuit region PERI, may be formed in an uppermost metal layer of the cell region CELL. A contact may not be formed on the upper metal pattern 2392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

In an example embodiment, the nonvolatile memory device 2000, such as described in FIG. 28, can operate and can include device components according to one or more of the example embodiments described in FIGS. 1 to 26 and 27A to 27C previously.

A nonvolatile memory device or a storage device according to an embodiment of the inventive concept may be packaged using various package types or package configurations.

The present disclosure may be applied to various electronic devices including a nonvolatile memory device. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A nonvolatile memory device comprising:
a memory cell region including a first metal pad;
a peripheral circuit region including a second metal pad and vertically connected to the memory cell region by the first metal pad and the second metal pad;
a memory cell array in the memory cell region, the memory cell array including a plurality of mats corresponding to different bit-lines, each of the plurality of mats including a plurality of memory blocks and each of the plurality of memory blocks including a plurality of cell strings connected to a plurality of word-lines, a plurality of bit-lines, a plurality of string selection lines and a ground selection line;
a voltage generator in the peripheral circuit region, the voltage generator configured to generate word-line voltages;
a page buffer circuit in the peripheral circuit region, the page buffer circuit coupled to the memory cell array through the bit-lines and configured to provide bit-line voltages to the bit-lines;
a row decoder in the peripheral circuit region, the row decoder configured to transfer the word-line voltages to the plurality of word-lines; and
a control circuit in the peripheral circuit region, the control circuit configured to control the voltage generator, the row decoder and the page buffer circuit based on a command and an address from an outside of the nonvolatile memory device,
wherein the control circuit is configured to select different voltages to apply the selected different voltages through the first metal pad and the second metal pad to at least one of the word-lines or at least one of the bit-lines based on a determination that either only one mat operates or at least two mats of the plurality of mats operate simultaneously,
wherein the plurality of mats include a first mat and a second mat,
wherein each of the cell strings includes at least one ground selection transistor, a plurality of memory cells, and at least one string selection transistor coupled in series,
wherein the ground selection line is connected to each of the at least one ground selection transistor of the plurality of cell strings,
wherein the control circuit is configured to control the row decoder and the page buffer circuit such that levels of the word-line voltages or levels of the bit-line voltages applied to the bit-lines in a single mat mode are different from levels of the word-line voltages or levels of the bit-line voltages in a multi-mat mode, and
wherein an operation of the nonvolatile memory device is performed on one of the first mat and the second mat in the single mat mode, and an operation of the nonvolatile memory device is simultaneously performed on the first mat and the second mat in the multi-mat mode.

2. The nonvolatile memory device of claim 1, wherein the control circuit is configured to control the row decoder such that the levels of the word-line voltages in the single mat mode are smaller than the levels of the word-line voltages in the multi-mat mode.

3. The nonvolatile memory device of claim 1, wherein the control circuit is configured to control the row decoder such that the levels of the word-line voltages in the single mat mode are greater than the levels of the word-line voltages in the multi-mat mode.

4. The nonvolatile memory device of claim 1, wherein the control circuit is configured to control the page buffer circuit such that the levels of the bit-line voltages in the single mat mode are greater than the levels of the bit-line voltages in the multi-mat mode.

5. The nonvolatile memory device of claim 1, wherein the control circuit is configured to control the page buffer circuit such that the levels of the bit-line voltages in the single mat mode are smaller than the levels of the bit-line voltages in the multi-mat mode.

6. The nonvolatile memory device of claim 1, wherein the control circuit comprises:
a decision circuit configured to generate a mode signal designating one of a single mat mode and a multi-mat mode in response to the command, wherein an operation of the nonvolatile memory device is performed on one of the first mat and the second mat in the single mat mode, and an operation of the nonvolatile memory device is simultaneously performed on the first mat and the second mat in the multi-mat mode;

a first level/timing controller configured to generate a first control signal to control the row decoder according to the single mat mode or the multi-mat mode in response to the mode signal; and a second level/timing controller configured to generate a second control signal to control the page buffer circuit according to the single mat mode or the multi-mat mode in response to the mode signal.

7. The nonvolatile memory device of claim 6, wherein the first level/timing controller is configured to store levels of the word-line voltages for each of a program operation, a read operation and an erase operation on the memory cell array as a first command set in each of single mat mode and the multi-mat mode, and wherein the second level/timing controller is configured to store levels of bit-line voltages applied to the bit-lines for each of the program operation, the read operation and the erase operation on the memory cell array as a second command set in each of single mat mode and the multi-mat mode.

8. The nonvolatile memory device of claim 6, wherein the row decoder comprises:

a decoder configured to generate a first mat selection signal to select the first mat and a second mat selection signal to select the second mat in response to the address and the mode signal;

a first switch circuit coupled to the first mat and a plurality of selection lines coupled to the voltage generator; and a second switch circuit coupled to the second mat and the plurality of selection lines.

9. The nonvolatile memory device of claim 8, wherein the first switch circuit comprises:

a plurality of pass transistors coupled to the first mat through the plurality of string selection lines, the plurality of word-lines and the ground selection line; and a switch controller configured to generate switching control signals to control turn-on and turn-off of the pass transistors in response to the first mat selection signal and the first control signal.

10. The nonvolatile memory device of claim 1, wherein each of the memory blocks includes the plurality of cell strings disposed perpendicular to a substrate.

11. The nonvolatile memory device of claim 1, wherein the row decoder is configured to apply a first voltage to a string selection line from the plurality of string selection lines for a first period of time when a first operation of the nonvolatile memory device is performed for only one mat and to apply a second voltage to the string selection line for a second period of time different from the first period of time when the first operation is performed for both of the at least two mats simultaneously.

12. A nonvolatile memory device comprising:

a memory cell region including a first metal pad;

a peripheral circuit region including a second metal pad and vertically connected to the memory cell region by the first metal pad and the second metal pad;

a memory cell array in the memory cell region, the memory cell array including a plurality of planes, each of first and second planes of the planes including a plurality of memory blocks, each of the memory blocks including a plurality of cell strings connected to a plurality of word-lines, a plurality of bit-lines, a plurality of string selection lines and a ground selection line, a first cell string of the plurality of cell strings connected to a plurality of first word-lines, a first bit-line, a first string selection line and a first ground selection line, and a second cell string of the plurality of cell strings connected to a plurality of second word-lines, a second bit-line, a second string selection line and a second ground selection line;

a voltage generator in the peripheral circuit region, the voltage generator configured to apply word-line voltages to the plurality of first and second word-lines; and a control circuit in the peripheral circuit region, the control circuit configured to control at least one of the word-line voltages applied to at least one of the word-lines through the first metal pad and the second metal pad based on whether one or both planes of the first and second planes operate simultaneously, wherein each of the first and second cell strings includes at least one ground selection transistor, a plurality of memory cells, and at least one string selection transistor coupled in series, wherein the first ground selection line is connected to each of the at least one ground selection transistor of the plurality of cell strings of the first plane, wherein the second ground selection line is connected to each of the at least one ground selection transistor of the plurality of cell strings of the second plane, and wherein the control circuit is configured to control the word-line voltages by:

either applying a first voltage, for a first specific period of time, to at least one word-line of the plurality of first and second word-lines when only one of the first and second planes operates and applying a second voltage different from the first voltage, for the first specific period of time, to the at least one word-line when both of the first and second planes simultaneously operate, or applying a first voltage to at least one word-line of the plurality of first and second word-lines for a first period of time when only one of the first and second planes operates and applying the first voltage to the at least one word-line for a second period of time different from the first period of time when both of the first and second planes simultaneously operate.

13. The nonvolatile memory device of claim 12, further comprising:

first and second page buffers in the peripheral circuit region, the first and second page buffers connected to the first bit-line and the second bit-line respectively, and each configured to apply a bit-line voltage to each of the first and second bit-lines, wherein the control circuit is configured to control the bit-line voltage based on whether one or both planes of the first and second planes operate simultaneously, and wherein the control circuit is configured to control the bit-line voltage by:

either applying a third voltage, for a second specific period of time, to at least one bit-line of the first and second bit-lines when only one of the first and second planes operates and applying a fourth voltage different from the third voltage, for the second specific period of time, to the at least one bit-line when both of the first and second planes simultaneously operate, or applying a third voltage to at least one bit-line of the first and second bit-lines for a third period of time when only one of the first and second planes operates and applying the third voltage to the at least one bit-line for a fourth period of time different from the third period of time when both of the first and second planes simultaneously operate.

14. The nonvolatile memory device of claim 12, wherein a level of the second voltage is greater than a level of the first voltage, or
wherein the second period of time is longer than the first period of time.

15. The nonvolatile memory device of claim 12, wherein a level of the first voltage is greater than a level of the second voltage, or
wherein the first period of time is longer than the second period of time.

* * * * *